(12) United States Patent
Kida

(10) Patent No.: US 6,314,332 B1
(45) Date of Patent: Nov. 6, 2001

(54) MULTIPLE SEMICONDUCTOR TEST SYSTEM FOR TESTING A PLURALITY OF DIFFERENT SEMICONDUCTOR TYPES

(75) Inventor: Tomoyuki Kida, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/110,391

(22) Filed: Jul. 7, 1998

(30) Foreign Application Priority Data

Jul. 7, 1997 (JP) .................................................. 9-196436

(51) Int. Cl.$^7$ ...................................................... G06F 19/00
(52) U.S. Cl. ............................... 700/113; 700/2; 700/116; 700/121; 700/218
(58) Field of Search ........................... 700/95, 112, 121, 700/217, 228, 230, 115, 117, 113, 116, 218, 2; 29/407.01, 705, 711; 414/222.07, 222.13

(56) References Cited

U.S. PATENT DOCUMENTS

| 5,237,510 | * | 8/1993 | Kakizawa et al. | 700/214 |
| 5,984,498 | * | 11/1999 | Lem et al. | 700/2 |
| 5,995,646 | * | 11/1999 | Yonezawa et al. | 382/141 |
| 5,997,169 | * | 12/1999 | Watanabe et al. | 700/83 |
| 6,011,998 | * | 1/2000 | Lichti et al. | 700/230 |
| 6,122,566 | * | 9/2000 | Nguyen et al. | 700/218 |

FOREIGN PATENT DOCUMENTS 1-289133 * 11/1989 (JP) .
5-26959 * 2/1993 (JP) .
6-120316 * 4/1994 (JP) .

OTHER PUBLICATIONS

WPI Abstract Accession No. 98–034145.
WPI Abstract Accession No. 95–362642.
Patent Abstracts of Japan corresponding to JP2–210274.

* cited by examiner

*Primary Examiner*—William Grant
*Assistant Examiner*—Sheela Rao
(74) *Attorney, Agent, or Firm*—Sughrue, Mion, Zinn, Macpeak & Seas, PLLC

(57) ABSTRACT

In a semiconductor device test apparatus, a host computer having a data base writes test resultant data in the data base to output the test resultant data in response to a data request. Each of a plurality of testers performs an electric characteristic test based on a test program to generate a test resultant data for each of semiconductor devices to transmit to the host computer. Each of a plurality of handler sections sets the semiconductor devices of a pallet to a test head for the electric characteristic test. A loader section loads the semiconductor devices from a first tray to the pallet. An unloader section unloads the semiconductor devices from the pallet transported thereto to second trays based on the test resultant data from the host computer. A pallet transporting section transports the pallet to a specific one of the plurality of handler sections before the electric characteristic test, and transports the pallet to the unloader section from the specific one of the plurality of handler sections after the electric characteristic test.

23 Claims, 28 Drawing Sheets

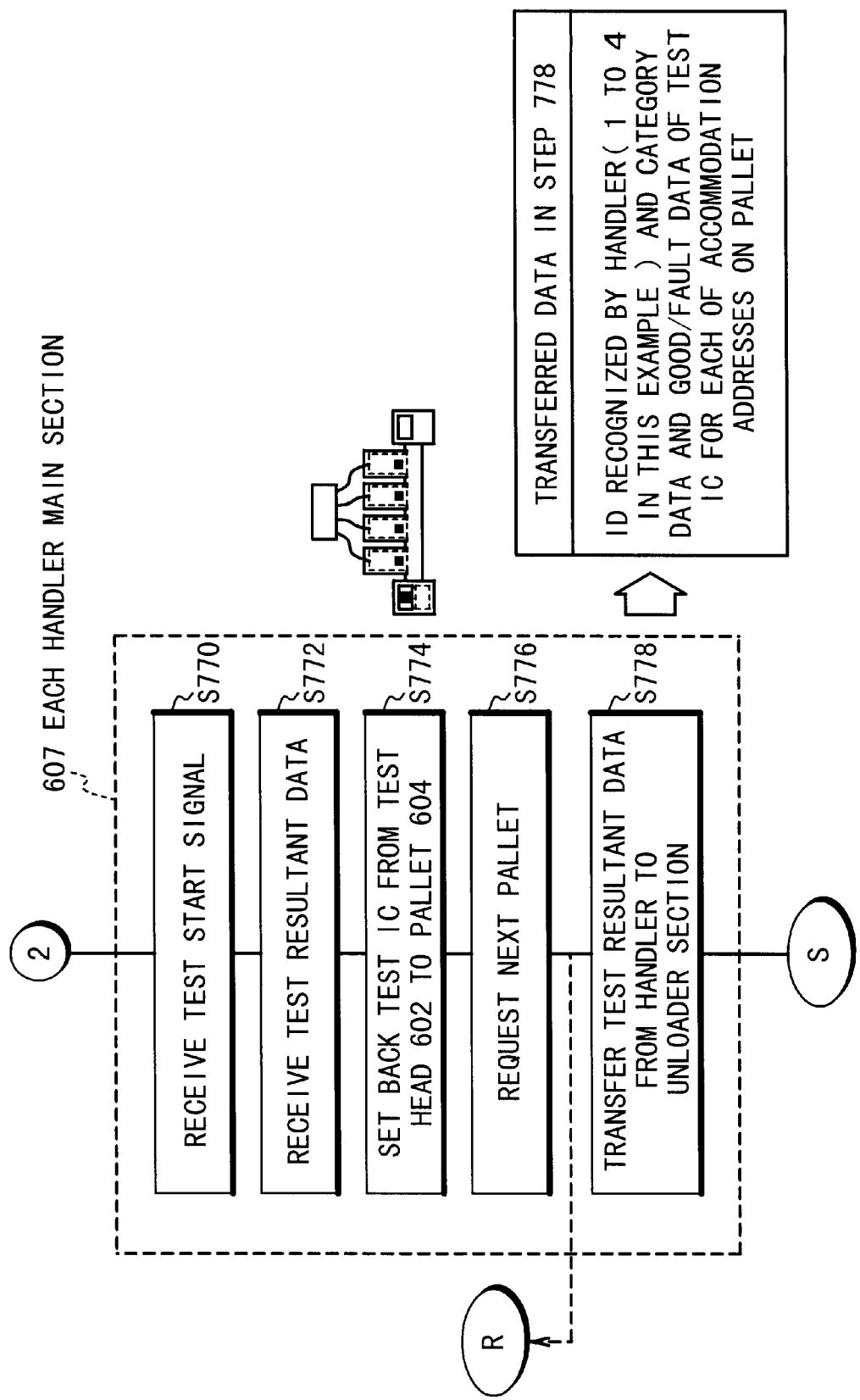

Fig. 3A
PRIOR ART
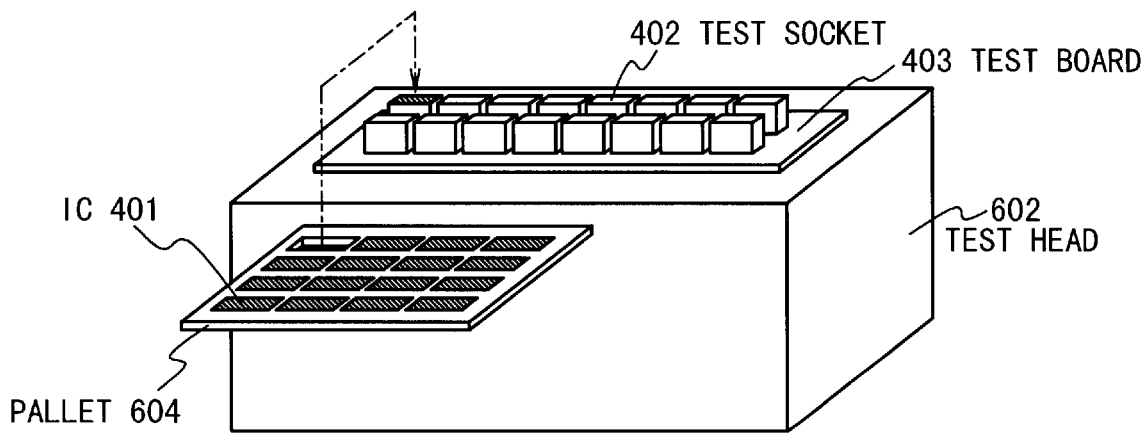
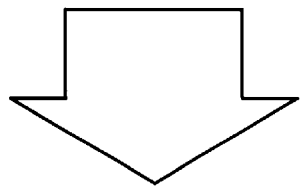
Fig. 3B
PRIOR ART
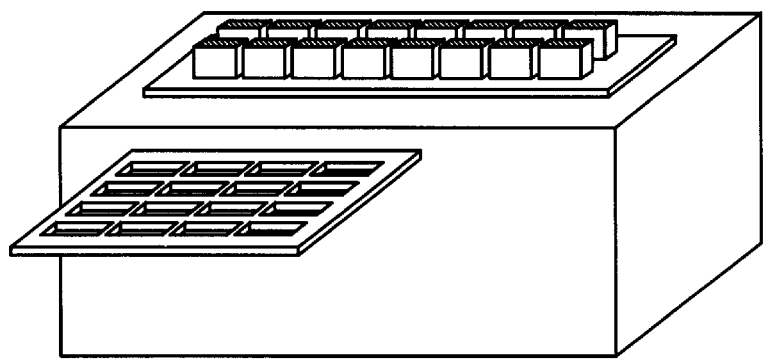

Fig. 9

```
PALLET ID X, [ LOT NO., LOT SIZE, TEST PROGRAM NAME ]
              [ [ 1 ROW 1 COLUMN TEST RESULTANT DATA OF IC 401 ]
                [ 1 ROW 2 COLUMN TEST RESULTANT DATA OF IC 401 ]
                                    ⋮

[ 2 ROW 1 COLUMN TEST RESULTANT DATA OF IC 401 ]
                [ 2 ROW 2 COLUMN TEST RESULTANT DATA OF IC 401 ]
                                    ⋮

[ n ROW m COLUMN TEST RESULTANT DATA OF IC 401 ] ]
```

Fig. 10

PALLET ID 1, [ LOT NO., LOT SIZE, TEST PROGRAM NAME ]
               [ [ 1 ROW 1 COLUMN TEST RESULTANT DATA OF IC 401 ]
                [ 1 ROW 2 COLUMN TEST RESULTANT DATA OF IC 401 ]
                           ⋮

[ 2 ROW 1 COLUMN TEST RESULTANT DATA OF IC 401 ]
                [ 2 ROW 2 COLUMN TEST RESULTANT DATA OF IC 401 ]
                           ⋮

[ n ROW m COLUMN TEST RESULTANT DATA OF IC 401 ] ]

PALLET ID 2, [ LOT NO., LOT SIZE, TEST PROGRAM NAME ]
               [ [ 1 ROW 1 COLUMN TEST RESULTANT DATA OF IC 401 ]
                [ 1 ROW 2 COLUMN TEST RESULTANT DATA OF IC 401 ]
                           ⋮

[ 2 ROW 1 COLUMN TEST RESULTANT DATA OF IC 401 ]
                [ 2 ROW 2 COLUMN TEST RESULTANT DATA OF IC 401 ]
                           ⋮

[ n ROW m COLUMN TEST RESULTANT DATA OF IC 401 ] ]

⋮

PALLET ID Z, [ LOT NO., LOT SIZE, TEST PROGRAM NAME ]
               [ [ 1 ROW 1 COLUMN TEST RESULTANT DATA OF IC 401 ]
                [ 1 ROW 2 COLUMN TEST RESULTANT DATA OF IC 401 ]
                           ⋮

[ 2 ROW 1 COLUMN TEST RESULTANT DATA OF IC 401 ]
                [ 2 ROW 2 COLUMN TEST RESULTANT DATA OF IC 401 ]
                           ⋮

[ n ROW m COLUMN TEST RESULTANT DATA OF IC 401 ] ]

Fig. 11

```
LOT NO.
[[ HANDLER 11, PROGRAM 1 ] , [ HANDLER 12, PROGRAM 1 ] , [ HANDLER 13, PROGRAM 1 ] , [ HANDLER 14, PROGRAM 1 ] ,
 [ HANDLER 21, PROGRAM 2 ] , [ HANDLER 22, PROGRAM 2 ] , [ HANDLER 23, PROGRAM 2 ] , [ HANDLER 24, PROGRAM 2 ] ,
 [ HANDLER 31, PROGRAM 3 ] , [ HANDLER 32, PROGRAM 3 ] , [ HANDLER 33, PROGRAM 3 ] , [ HANDLER 34, PROGRAM 3 ] ,
                                          -----
 [ HANDLER n1, PROGRAM n ] , [ HANDLER n2, PROGRAM n ] , [ HANDLER n3, PROGRAM n ] , [ HANDLER n4, PROGRAM n ]]
```

Fig. 12

```
[[ HANDLER 11, TESTER 1 ] , [ HANDLER 12, TESTER 1 ] , [ HANDLER 13, TESTER 1 ] , [ HANDLER 14, TESTER 1 ] ,
 [ HANDLER 21, TESTER 2 ] , [ HANDLER 22, TESTER 2 ] , [ HANDLER 23, TESTER 2 ] , [ HANDLER 24, TESTER 2 ] ,
 [ HANDLER 31, TESTER 3 ] , [ HANDLER 32, TESTER 3 ] , [ HANDLER 33, TESTER 3 ] , [ HANDLER 34, TESTER 3 ] ,
                                                    ‥‥‥
 [ HANDLER n1, TESTER n ] , [ HANDLER n2, TESTER n ] , [ HANDLER n3, TESTER n ] , [ HANDLER n4, TESTER n ]]
```

MULTIPLE SEMICONDUCTOR TEST SYSTEM FOR TESTING A PLURALITY OF DIFFERENT SEMICONDUCTOR TYPES

BACKGROUND OF THE INVENTION

1. Field of the Invention

The present invention relates to a semiconductor device test apparatus of a plurality of semiconductor devices, more particularly, to a semiconductor device test apparatus for performing an electric characteristic test of each of the plurality of semiconductor devices grouped into one or more lots using a plurality of testers. Also, the present invention relates to a semiconductor device test apparatus for performing an electric characteristic test of a plurality of kinds of lots of a plurality of semiconductor devices, using a plurality of testers.

2. Description of the Related Art

As a conventional semiconductor device test apparatus, a semiconductor device test apparatus is proposed in, for example, Japanese Laid Open Patent Disclosure (JP-A-Heisei 5-26959). In the semiconductor device test apparatus, there is not necessity of the modification of design of a test head and a handler main section even if the number of semiconductor devices to be measured by a tester at the same time increases.

FIG. 1 is a diagram for illustrating the structure of the semiconductor device test apparatus proposed in the above Japanese Laid Open Patent Disclosure (JP-A-Heisei 5-26959). FIGS. 3A to 3B are expanded perspective views for illustrating a main section of the test head of the semiconductor device test apparatus.

In FIG. 1, the semiconductor device test apparatus is composed of a tester 601, test heads 602, cables 603, handler main sections 607, a loader section 608, a pallet transporting section 609 and an unloader section 610. The tester 601 performs an electric characteristic test of the semiconductor devices. The test heads 602 are electrically connected with the tester 601 through the cables 603. The plurality of handler main sections 607 are arranged in parallel to be connected to the test heads 602. The loader section 608 transfers the semiconductor devices from interprocess 605 trays to the pallets 604. Each of the interprocess trays 605 is a unit for transporting the semiconductor devices 401 between this apparatus and another apparatus. The loader section 608 sets pallets 604 in which the semiconductor devices before the electric characteristic test are located therein. The pallet transporting section 609 transports the pallets 604 supplied from the loader section 608 to each of the handler main sections 607. After the electric characteristic test, the pallets 604 are transported from each of the handler main sections 607 to the unloader section 609 by the pallet transporting section 609. The unloader section accommodates the pallets 604 which contain the semiconductor devices after the electric characteristic test.

Also, in FIGS. 3A and 3B, a reference number 402 denotes a test socket for the semiconductor device 401 to be inserted and held in case of the electric characteristic test. A reference number 403 denotes a test board for the plurality of test sockets 402 to be mounted for electric connection with the test head 602.

First, the transporting state of the semiconductor devices 401 and the operation of each section of the apparatus will be described with reference to FIG. 1 and FIGS. 3A and 3B.

The interprocess tray 605 containing one lot of semiconductor devices 401 before the electric characteristic test is set in the loader section 608. Then, the semiconductor devices 401 are moved from the interprocess tray 605 to the pallets 604 for apparatus exclusive use. After that, the pallets 604 are sent out to the pallet transporting section 609.

The pallet transporting section 609 transports the pallets 604 to each of the handler main sections 607 in order. In each handler main section 607, the semiconductor devices 401 in the pallet 604 are electrically connected with the test board 403 fixed on the test head 602. Then, the electric characteristic test is performed by the tester 601 through the cable 603.

Next, the pallet 604 with the semiconductor devices after the electric characteristic test is sent out from the handler main section 607 to the pallet transporting section 609. Subsequently, the pallet 604 is transported to the unloader section 610.

In the unloader section 610, the semiconductor devices 401 after the electric characteristic test which are provided in each of the pallets 604 are classified and accommodated into the interprocess trays 605 which are prepared for every defective product and category, based on quality information and a category mechanism (Hereinafter, two kinds of data are referred to as a "test resultant data") which are transmitted from the handler main section.

The above description is about the flow of the semiconductor devices 401 for the once electric characteristic test by the tester 601 and the operation of each section. This operation is repeated until all the pallets 604 in the loader section 608 are tested and accommodated in the unloader section 610.

Next, the processing flow to realize the above-mentioned operation will be explained. FIGS. 2A to 2F are diagrams to describe the details of the processing flow. It should be noted that the processing flow shown in FIGS. 2A to 2F is not disclosed in the above Japanese Laid Open Patent Disclosure (JP-A-Heisei 5-26959). Therefore, FIGS. 2A to 2F show the processing flow considered in such a manner that the semiconductor device test apparatus shown in FIG. 1 functions in the actual test process.

Steps 700 to 705: are a preparation procedure of each of the sections (the loader section 608 and the tester 601) of the apparatus by hand work.

Steps 710 to 720: are a control procedure for separation of the pallets 604 in the loader section 608 and the transporting operation to each of the handler sections 607.

Steps 730, and 740 to 742: are a handling operation procedure of the pallets 604 and the semiconductor devices 401 in the pallet transporting section 609 and each of the handler sections 607.

Steps 760 to 766: are a control procedure from the electric characteristic test by the tester 601 to the information transmission to the handler sections 607.

Steps 770 to 778: are a control procedure from an operation to collect the semiconductor devices 401 after the electric characteristic test from the test head 602 to the information transmission to deliver the next un-measured pallet 604.

Step 780: is a control procedure from the collection of the pallets 604 by the pallet transporting section 609 and the delivery to the unloader section 610.

Steps 790 to 794: are a control procedure in which the semiconductor devices 401 are accommodated from the pallets 604 and classified into interprocess trays 605 based on classification information.

In the case that the semiconductor devices 401 after the electric characteristic test are classified and accommodated in the step 794, it is recognized based on the order of the pallets 604 that the pallet 604 is processed by which one of the handler sections 607. For instance, in case of the structure shown in FIG. 1, the numbers are allocated as 1, 2, 3, 4 from the handler section 607 near the unloader section 610. The judgement of the classification is performed based on the numbers, and the quality information and the category information of each of the semiconductor devices 401 which are transmitted from each of the handler sections 607.

Also, the lot is set in the loader section 608 is 1 lot. Accordingly, the semiconductor devices 401 tested by a single tester 601 are supplied for one lot.

When the electric characteristic test is performed to a DRAM (random access memory) as the semiconductor device to be tested, the tester (memory tester) 601 is possible to test 64 DRAMs at maximum at the same time, if the DRAM is a single bit I/O type.

In case of the above conventional apparatus, 16 semiconductor devices per the handler section (test head) can be processed. However, there is a case that the semiconductor devices are tested not in units of 16 pieces but in unit of 64 pieces. In this case, when a lot size (quantity of semiconductor devices of the lot) is not integer times of 64, the last cycle of the electric characteristic test will be performed in the state in which some of the handler sections are not supplied with the semiconductor device, resulting in the operation loss of the tester 601.

The electric characteristic test is the process of the semiconductor device process close to the last process. Therefore, it is impossible to always adjust the lot size to be integer times of 64 because of the production yield change in the semiconductor device process. For this reason, in the above conventional apparatus, the operation loss is always brought about.

In this way, the electric characteristic test of the semiconductor devices is performed by a single tester and a plurality of handler sections which are connected to the tester. Even if only one semiconductor device is lack, the conventional semiconductor device test apparatus must test the remaining semiconductor devices. In this case, therefore, there is a problem in that the operation loss is great in this conventional semiconductor device test apparatus with prolongation of the test time of the semiconductor device such as a large scaled DRAM.

SUMMARY OF THE INVENTION

The present invention is accomplished in view of the above problems. Therefore, the object of the present invention is to provide a semiconductor device test apparatus which makes it possible to set a plurality of lots of ICs and a plurality of types of ICs over a plurality of testers, and can reduce the operation loss.

In order to achieve an aspect of the present invention, a semiconductor device test apparatus includes a network and a host computer connected to the network and having a data base, for writing test resultant data in the data base, and for outputting the test resultant data in response to a data request. A plurality of testers is connected to the network, and each of the plurality of testers performs an electric characteristic test based on a test program to generate a test resultant data for each of semiconductor devices, and transmits the test resultant data to the host computer. A plurality of handler sections are grouped into a plurality of sets corresponding to the plurality of testers, and each of the plurality of handler sections sets the semiconductor devices of a pallet transported thereto to a test head for the electric characteristic test. Each of the plurality of testers has the test heads for corresponding handler sections. A loader section is operatively connected to the network, and loads the semiconductor devices from a first tray to the pallet. An unloader section is connected to the network, and unloads the semiconductor devices from the pallet transported thereto to second trays based on the test resultant data from the host computer. A pallet transporting section transports the pallet to a specific one of the plurality of handler sections before the electric characteristic test, and transports the pallet to the unloader section from the specific one of the plurality of handler sections after the electric characteristic test.

Each of the plurality of handler sections issues a supply request as a request issuing handler section. At this time, the loader section identifies the request issuing handler section from the supply request to obtain a handler section identifier, loads the semiconductor devices to the pallet, and informs the handler section identifier to the pallet transporting section. Also, the pallet transporting section transports the pallet to the request issuing handler section. In this case, the loader section informs a pallet identifier of the pallet to the request issuing handler section. Each of the plurality of handler sections receives the pallet identifier when issuing the supply request, and compares a pallet identifier of the transported pallet with the received pallet identifier, and receives the pallet from the pallet transporting section when both of the pallet identifiers are coincident with each other.

Each of the plurality of testers automatically loads the test program in response to a test program name. A control terminal connected to the network transmits the test program name inputted thereto to the plurality of testers via the network.

The control terminal may transmit a pallet identifier of the pallet to the host computer. In this case, the host computer stores the pallet identifier in the data base, and stores the test resultant data for each of the semiconductor devices loaded in the pallet in the data base in relation to the pallet identifier.

The unloader section reads a pallet identifier of the pallet transported thereto, and outputs the read pallet identifier to the host computer as the data request. At this time, the host computer reads a data set associated with the read pallet identifier and containing the test resultant data from the data base to output to the unloader section.

The semiconductor device test apparatus may further include a control terminal, which inputs plurality of lot numbers of lots, pallet identifiers of a plurality of the pallets used for each of the lots, handler identifiers of ones of the plurality of handler sections used for each of the lots, and test program names for ones of the plurality of testers corresponding to the handler identifiers. Each of the lots includes the semiconductor devices to transmits to the host computer and the loader section.

Each of the plurality of handler sections issues a supply request as a request issuing handler section. At this time, the loader section identifies the request issuing handler section from the supply request to obtain a handler section identifier, and determines whether the obtained handler section identifier is present in the handler section identifiers for a current lot transmitted from the control terminal. The loader section neglects the supply request when the obtained handler section identifier is not present in the handler section identifiers for the current lot. On the other hand, the loader section loads the semiconductor devices to the pallet when the obtained handler section identifier is present in the handler section identifiers for the current lot, and informs the handler section identifier to the pallet transporting section.

The pallet transporting section transports the pallet to the request issuing handler section.

The loader section may inform a pallet identifier of the pallet to the request issuing handler section. At this time, each of the plurality of handler sections receives the pallet identifier when issuing the supply request, and compares a pallet identifier of the transported pallet with the received pallet identifier, and receives the pallet from the pallet transporting section when both of the pallet identifiers are coincident with each other.

The host computer outputs the test program names to the plurality of testers, respectively. Each of the plurality of testers receives the test program name and automatically loads the test program in response to the test program name.

Also, the host computer stores the pallet identifiers for each of the lots in the data base, and stores the test resultant data for each of the semiconductor devices loaded in the pallet supplied from each of the plurality of testers in the data base in relation to the pallet identifier.

In order to achieve another aspect of the present invention, a method of testing semiconductor devices in a test apparatus, includes the steps of:

loading semiconductor devices for a lot to pallets by a loader section;

performing a first transportation of each of the pallets to a specific one of a plurality of handler sections before an electric characteristic test by a transport section;

setting the semiconductor devices of the pallet to a test head of a tester corresponding to the specific handler section;

performing the electric characteristic test based on a test program by a tester corresponding to the specific handler section to generate a test resultant data for each of the semiconductor devices;

storing the test resultant data in a data base in association with the pallet by a host computer;

performing a second transportation of the pallet to an unloader section from the specific one of the plurality of handler sections after the electric characteristic test by the transport section;

unloading the semiconductor devices to second trays based on the test resultant data from the host computer.

BRIEF DESCRIPTION OF THE DRAWINGS

FIGS. 2A to 2F are flow charts to describe the operation procedure of the conventional semiconductor device test apparatus;

FIGS. 3A to 3B are perspective views for illustrating a test head of the conventional semiconductor device test apparatus and a tool connected with the test head;

FIGS. 5A to 5I are flow charts to describe the process flow of the semiconductor device test apparatus according to the first embodiment of the present invention;

FIG. 9 is a diagram to describe the data structure (1) of a data base of the semiconductor device test apparatus according to the second embodiment of the present invention;

FIG. 10 is a diagram to describe the data structure (2) of a data base of the semiconductor device test apparatus according to the second embodiment of the present invention;

FIG. 11 is a diagram to describe the data structure (3) of a data base of the semiconductor device test apparatus according to the second embodiment of the present invention; and FIG. 12 is a diagram to describe the data structure (4) of a data base of the semiconductor device test apparatus according to the second embodiment of the present invention.

DESCRIPTION OF THE PREFERRED EMBODIMENTS

Next, the semiconductor device test apparatus of the present invention will be described below in detail.

The semiconductor device test apparatus of the present invention is composed of a host computer, a plurality of testers, a loader mechanism, an unloader mechanism and bar code readers to set a plurality of lots of semiconductor devices and a plurality of types of semiconductor devices over a plurality of testers. Also, the semiconductor device test apparatus of the present invention is composed of a plurality of handler sections connected to each other, and a pallet transporting section to transport a plurality of lots of semiconductor devices to the plurality of handler sections and the plurality of testers.

The loader mechanism transfers the semiconductor devices to pallets from interprocess trays used between the manufacturing process of the semiconductor devices before and after the electric characteristic test and the process for the electric characteristic test. Also, the loader mechanism sends out the pallets to which the semiconductor devices are transferred, to the transporting section based on delivery request from the handler sections.

The unloader mechanism accommodates the pallets in which the semiconductor devices after the electric characteristic test are set and which are transported by the transporting section. The unloader mechanism transfers the semiconductor devices into the interprocess trays while classifying them, based on the electric characteristic test results which are received from the host computer.

In the semiconductor device test apparatus of the present invention, the loader mechanism and the unloader mechanism are connected to extend over the plurality of handler section and the plurality of testers. All of pallet ID data and the lot data are controlled by the host computer. The pallet transporting section controls the transportation of the pallets. Thus, the plurality of lots of semiconductor devices and the plurality of types of semiconductor devices can be set.

The semiconductor device test apparatus according to the first embodiments of the present invention will be described below in detail with reference to the attached drawings.

Figure 4:
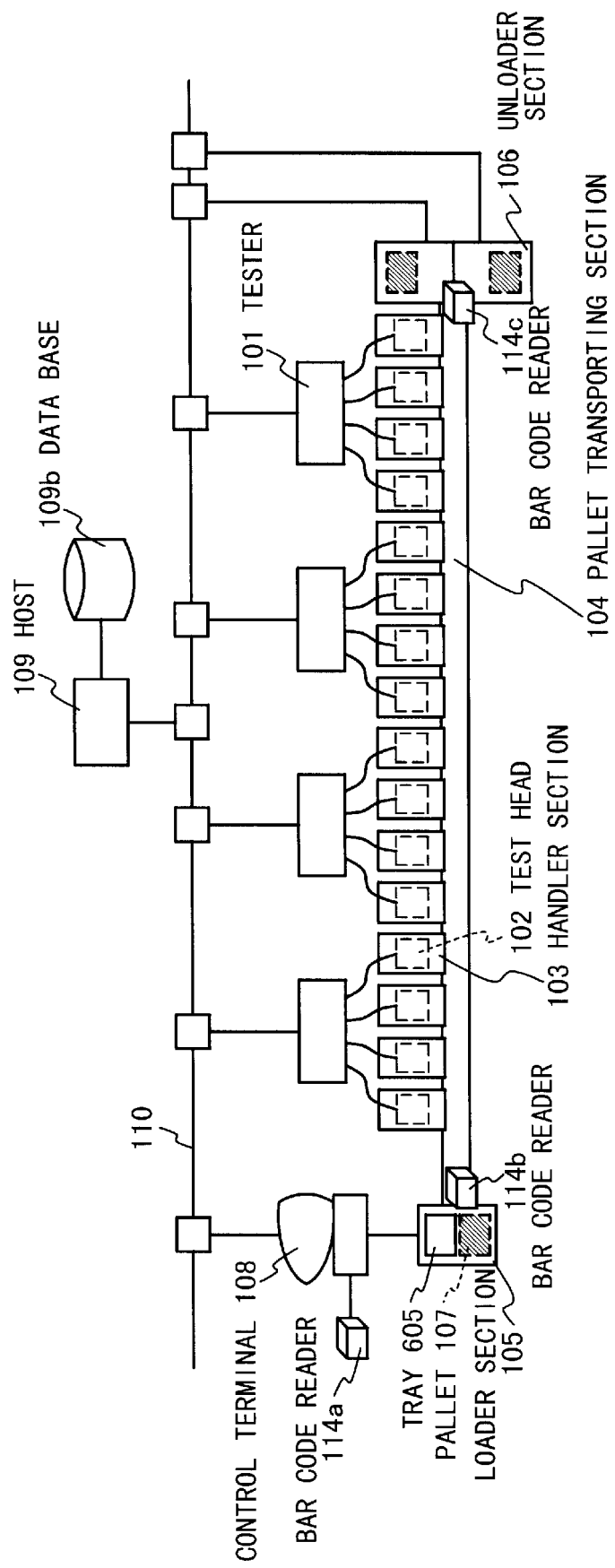
FIG. 4 is a block diagram for illustrating the structure of a semiconductor device test apparatus according to a first embodiment of the present invention.
Figure 6:
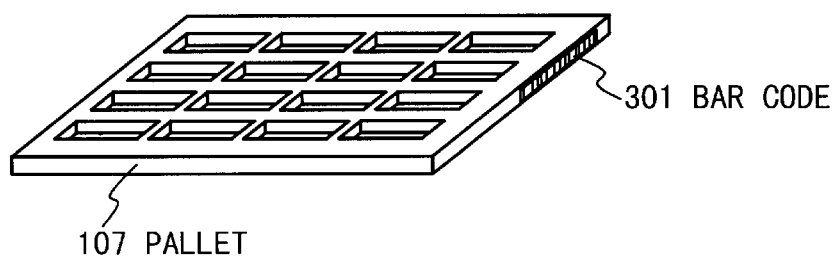
FIG. 6 is a perspective view for illustrating a pallet for the semiconductor device transportation used in the semiconductor device test apparatus according to the first embodiment of the present invention.
Figure 7A:
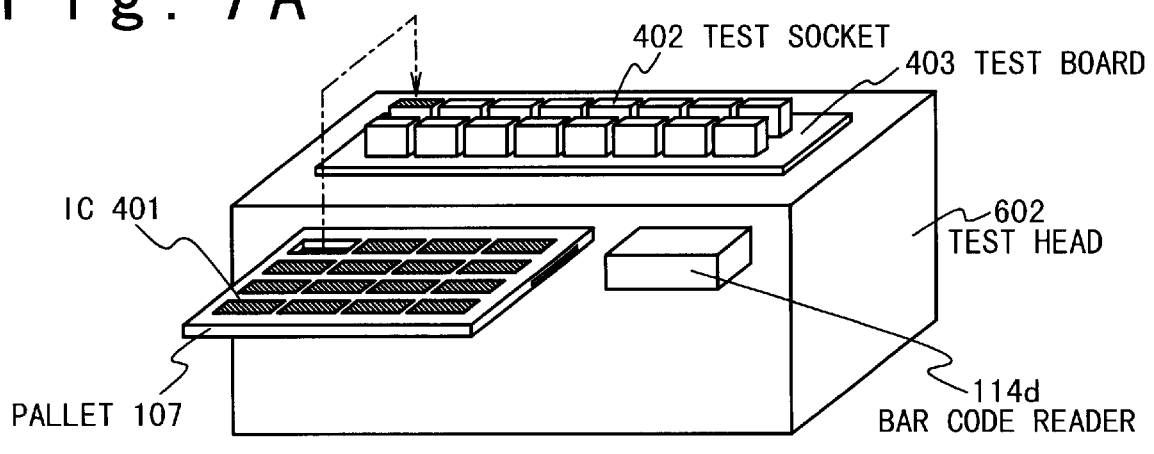
FIGS. 7A and 7B are perspective views for illustrating a test head and a tool connected with the test head in the semiconductor device test apparatus according to the first embodiment of the present invention.
Figure 7B:
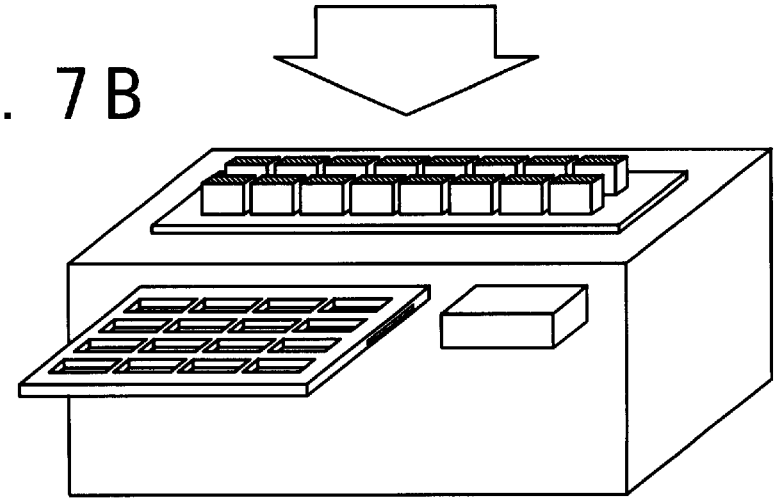

FIG. 4 is a block diagram illustrating the structure of the semiconductor device test apparatus according to the first embodiment of the present invention. FIGS. 5A to 5I are flow charts to describe the operation procedure of the semiconductor device test apparatus according to the first embodiment of the present invention. Also, FIG. 6 is a perspective view illustrating a pallet for the semiconductor device transportation in the semiconductor device test apparatus according to the first embodiment of the present invention. FIGS. 7A and 7B are perspective views illustrating a main section of the test head of the semiconductor device test apparatus according to the first embodiment of the present invention.

Referring to FIG. 4, the semiconductor device test apparatus in the first embodiment is composed of a host computer 109, a data base 109b, a network 110, a plurality of testers 101, a plurality of handler sections 103 for each of the testers 101, a control terminal 108 with a bar code reader 114a, a load section 105 with a bar code reader 114b, a pallet transporting section 104, and an unloader section 106 with a bar code reader 114c.

Each of the plurality of testers 101 has a test head 102. The testers 101, the control terminal 108, the host computer 109, the unloader section 106 are connected through the network 110. The loader section 105 is connected with the control terminal 108. The pallet transporting section 104 can transport the pallets 107 to each of the handler sections 103 between the loader section 105 and the unloader section 106.

The operation of the semiconductor device test apparatus according to the first embodiment of the present invention will be described below with reference to FIGS. 5A to 5I.

Figure 5A:
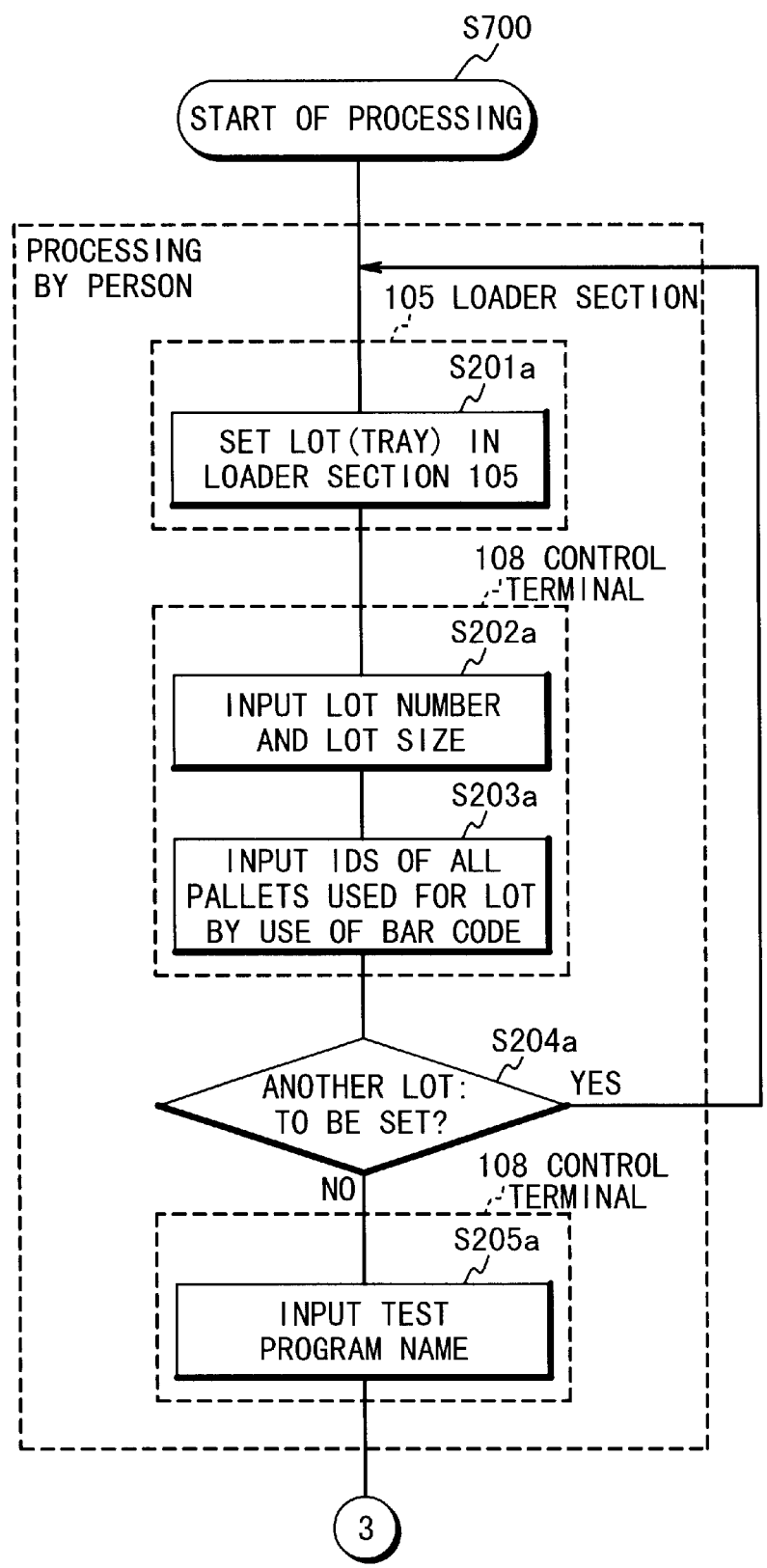
Figure 5B:
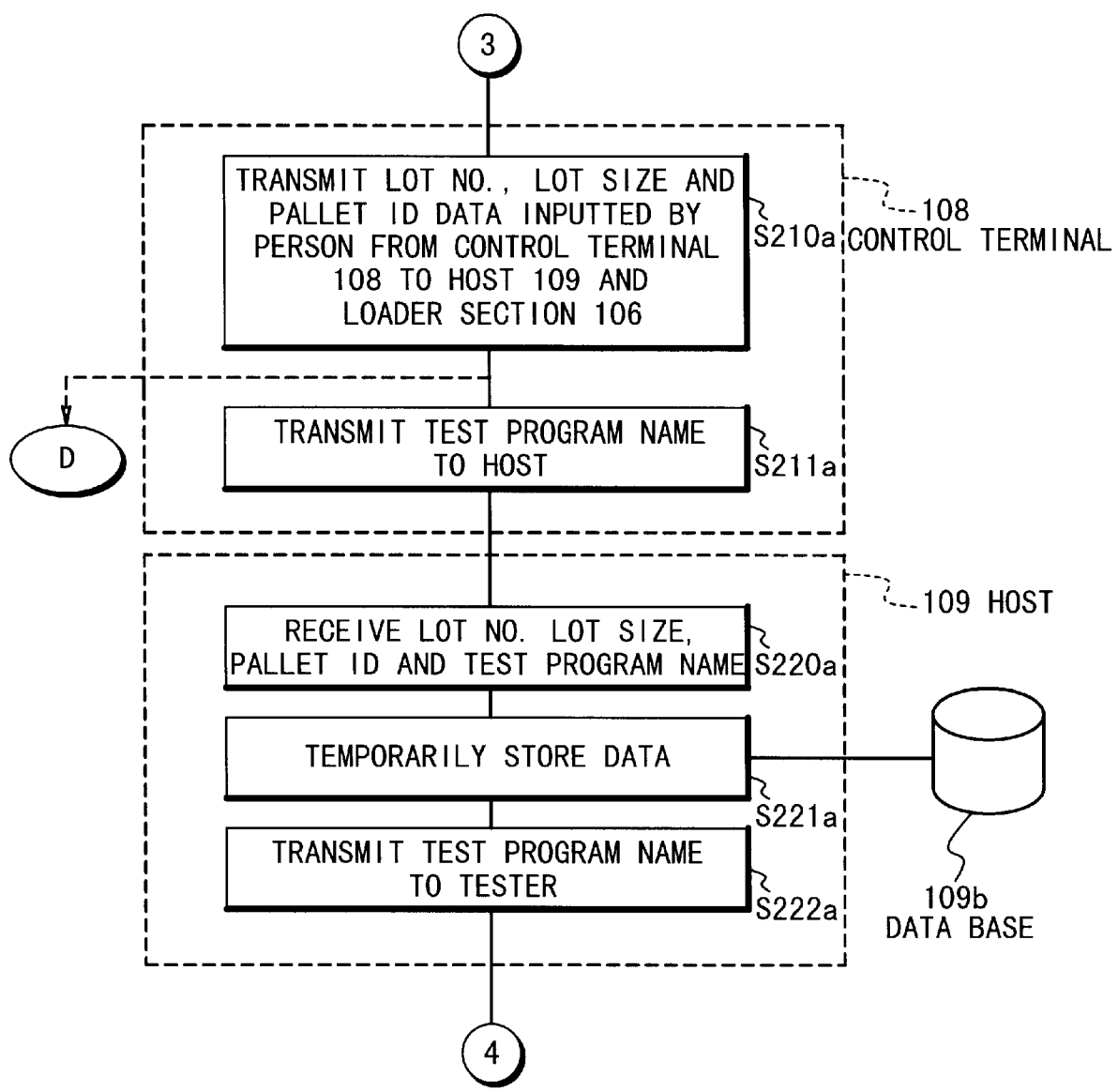
Figure 5C:
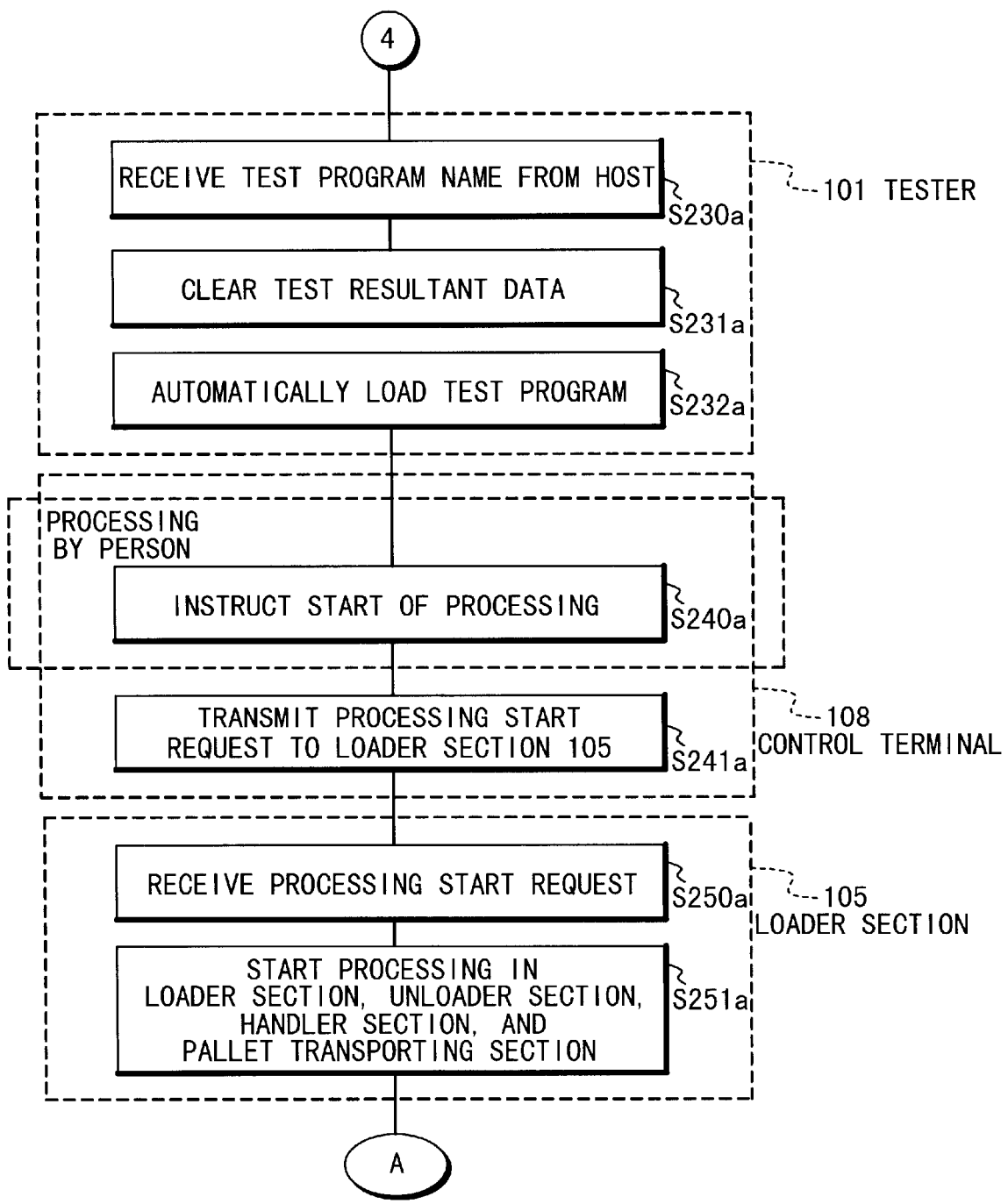

Referring to FIG. 5A, steps 201a to 205a show a preparing procedure to input data of test lots of semiconductor devices to the test apparatus and physical setting of the lots on the loader section 105.

One lot is composed of a plurality of interprocess trays 605 used outside of the semiconductor device test apparatus. The operator first supplies these interprocess trays 605 to the loader section 105 (step 201a). At the time of the preparation procedure, the pallets 107 used for the transportation are supplied at the same time. The pallet 107 has a bar code data 301 as a unique identification data. The semiconductor devices which have been loaded in the interprocess trays 605 are transferred to the pallets 107 by the loader section 105. The pallet is used for the semiconductor device transportation only in the semiconductor device test apparatus.

The operator inputs a lot size (the number of semiconductor devices for one lot) and a lot number of the lot from a keyboard of the control terminal 108 which is connected to the network (step 202a). The bar codes data of all the pallets 107 are read from the bar code reader 114a attached to the control terminal 108. The pallets 107 are prepared to set the semiconductor devices for the electric characteristic test of this lot (step 203a). When another lot of semiconductor devices which can be tested by use of a same test program exists (branch to Yes at step 204a), the above-mentioned procedure is repeated (steps 201a to 204a in FIG. 5A) to set a plurality of lots, if the number of lots is within an allowable value in the loader section 105. When the loader section 105 is full or the other lot which can be tested by use of the same test program is not present (branch to NO in step 204a), the supply of the semiconductor devices of the interprocess trays 605 to the loader section 105 is ended.

Next, the operator inputs the name of the test program name necessary to perform the electric characteristic test of the semiconductor devices from the control terminal 108 (step 205a). The control terminal 108 transmits three kinds of data such as the lot numbers and the lot sizes, which are inputted from the keyboard of the control terminal 108, and the pallet identifiers, which are read by the bar code reader 114a, to the host computer 109 and the loader section 105 through the network 110. The test program name is transmitted only to the host computer 109 (steps 210a and 211a of FIG. 5B). Thus, the preparation procedure is ended.

The host computer 109 receives the above data supplied from the control terminal 108, and temporarily stores them in the data base 109b. Moreover, the host computer 109 transmits the test program name to all the testers 101 which are connected to the network 110 (steps 220a to 222a in FIG. 5B).

When receiving the test program name which has been transmitted from the host computer 109 (step 230a of FIG. 5C), each of the testers 101 clears all results (the test resultant data) of the previous electric characteristic test (step 231a). Also, the tester 101 reads a test program of the received name from its own hard disk unit (not illustrated in FIG. 4) to develop in a memory of the tester 101 (automatic loading of the test program) (step 232a).

Each of the processes of the above steps 210a to 232a is automatically performed by the control terminal 108, the host computer 109 and each of the testers 101.

When the loading of the test program into each tester 101 is completed, a data indicating that the preparation for performing the electric characteristic test is completed is displayed from the tester 101 onto the control terminal 108 via the host computer 109 and the network 110. When the display is made, the operator inputs a command signal for the procedure start from the control terminal 108 (step 240a).

When receiving this command signal, the control terminal 108 transmits a processing start request to the loader section 105 (step 241a). The loader section 105 starts the operation in response to the processing start request. Also, the loader section 105 starts the operations of the pallet transporting section 104, the handler sections 103 and the unloader section 106 which are required to operate in relation to the operation of the loader section 105 (steps 250a and 251a).

When starting its operation, the loader section 105 first confirms whether or not a supply request signal of the pallet 107 from the handler sections 103 is present (step 215b). When it is determined that there is no request, the following operation is not performed (the loader section 105 is set to a waiting state).

When confirming the request (branch to Yes in step 215b of FIG. 5D), the loader section 105 determines which one of the handler sections 103 issues the request. Also, the loader section 105 receives various kinds of data such as the lot number, the lot size and the pallet identifiers of the first test lot which has been transmitted in the above step 210a from the control terminal 108 (step 220b). The handler sections 103 and the loader section 105 are connected through the pallet transporting section 104 in a network manner to set a port to each of the handler sections 103. Thus, the loader section 105 is possible to know a unique logic address of each of the handler sections (hereinafter, to be referred to as a "handler identifier") in the network (step 225b in FIG. 5D).

Next, the loader section 105 calculates a quantity of ones of the semiconductor devices of the supplied lot which are left in the interprocess tray 605. The loader section 105 determines whether or not this value is a positive number (step 230b). When the result of the calculation is equal to or less than "0", the loader section 105 ends the transferring process of this lot. Then, the loader section 105 reads the various type of data of the lot supplied next and starts the transferring process for the next lot. In this case, when there is not the next lot information (branch to No in step 235b), the loader section 105 determines that there is no lot to be supplied and stops all the operations (step 299b).

On the other hand, when the calculation result (the quantity of semiconductor devices which are left in the interprocess tray 605) is a positive number, the loader section 105 determines whether or not there is any pallet 107 to which the semiconductor devices can be transferred, by an optical sensor and so on. When there is not any pallet 107 to which the semiconductor devices can be transferred (branch to No in step 240b), the loader section 105 generates an alarm to warn the operator. At the same time, the control terminal 108 performs the display to promote the supply of additional pallets 107 (step 280b).

The loader section 105 reads, as the pallet identifiers, the bar codes 301 of the pallets 107 by the bar code reader 114b provided between the loader section and the pallet transporting section 107, specifically at the exit of the loader section to the pallet transporting section 107 (step 245b).

In step 250, when the read and identified pallet identifier is not equal to any one of the pallet identifiers received in the above step 220b, the loader section 105 generates an alarm to warn the operator. At the same time, the control terminal 108 displays the confirmation request of the pallet identifier in response to the alarm (step 285b).

After confirming that the read pallet identifier is equal to one of the pallet identifiers received in the above step 220b (step 250b), the loader section 105 transfers test semiconductor devices from the interprocess trays 605 to the pallet 107 (step 255b). The number of test semiconductor devices which are completely transferred is counted (step 257b). This value is used for the calculation in step 230b.

The counting process of the test semiconductor devices in step 257b is accomplished by calculating an OR (the logic summation) signal of the transferring operation and an absorption sensor signal, because an absorption sensor is installed in a pick & place head section of a semiconductor device transfer arm of the loader section 105.

Next, the loader section 105 starts the transporting operation of the pallets 107, to which the transferring operation of the semiconductor devices is completed, to the handler section 103.

First, the loader section 105 transports the pallet with the test semiconductor devices to the handler section 103 which has issued the supply request of the pallet, and then transmits the pallet identifier of the transported pallet 107 (step 260b). Next, the loader section 105 transmits the handler identifier to the handler section 103, to which the pallet 107 should be transported, to the pallet transporting section 104 (step 265b). Thereafter, the load section 105 sends out the pallet 107 to the pallet transporting section 104 (step 270b).

When the transportation of one pallet 107 is completed, the load section 105 checks to see whether or not there is a similar supply request from another handler section 103 (step 275b). When there is the supply request, the control returns to the step 230b to repeat the above-mentioned operation until any request is not present or any lot or the test semiconductor devices to be supplied is not present.

The pallet transporting section 104 is provided on the network connection extending from the loader section 105 to the unloader section 106 via each of the handler main section 103, as described above. Because being possible to recognize each handler identifier, the pallet transporting section 104 transports the pallet 107 to a target one of the handler sections 103 based on the delivery information or the handler identifier which has been received in the step 265b of FIG. 5E from the loader section 105 (steps 210c and 215c of FIG. 5F).

Figure 5D:
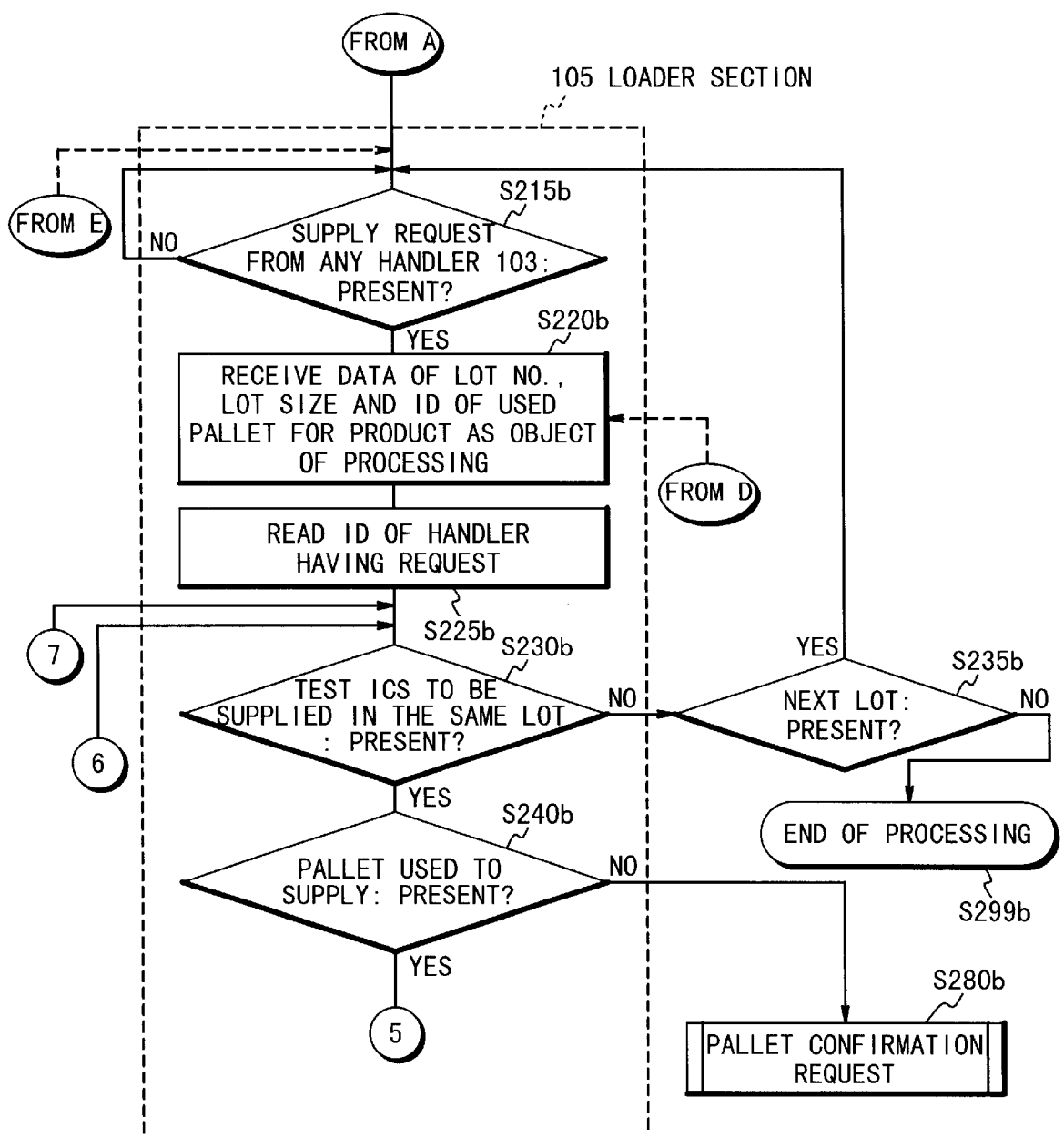
Figure 5E:
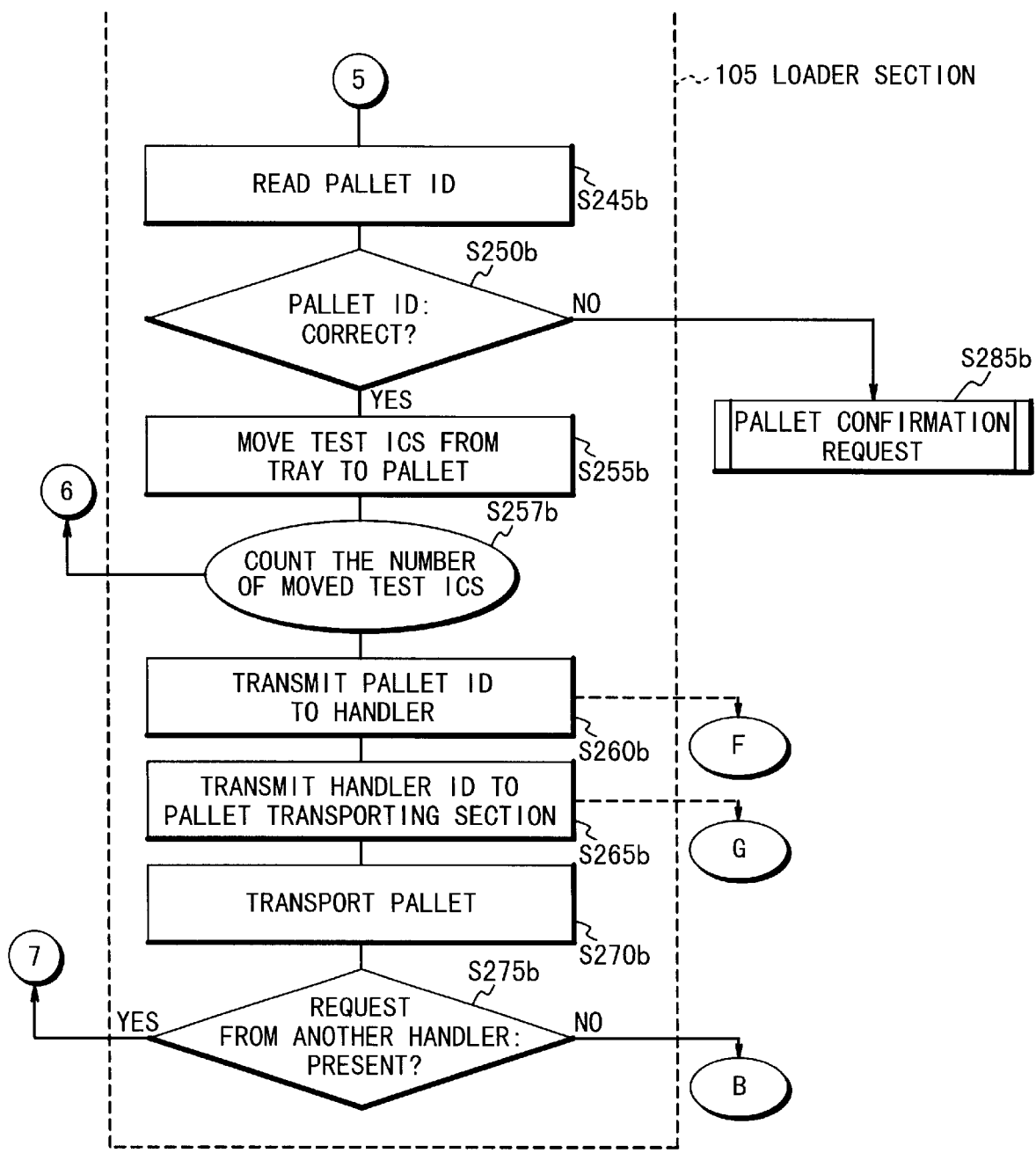
Figure 5F:
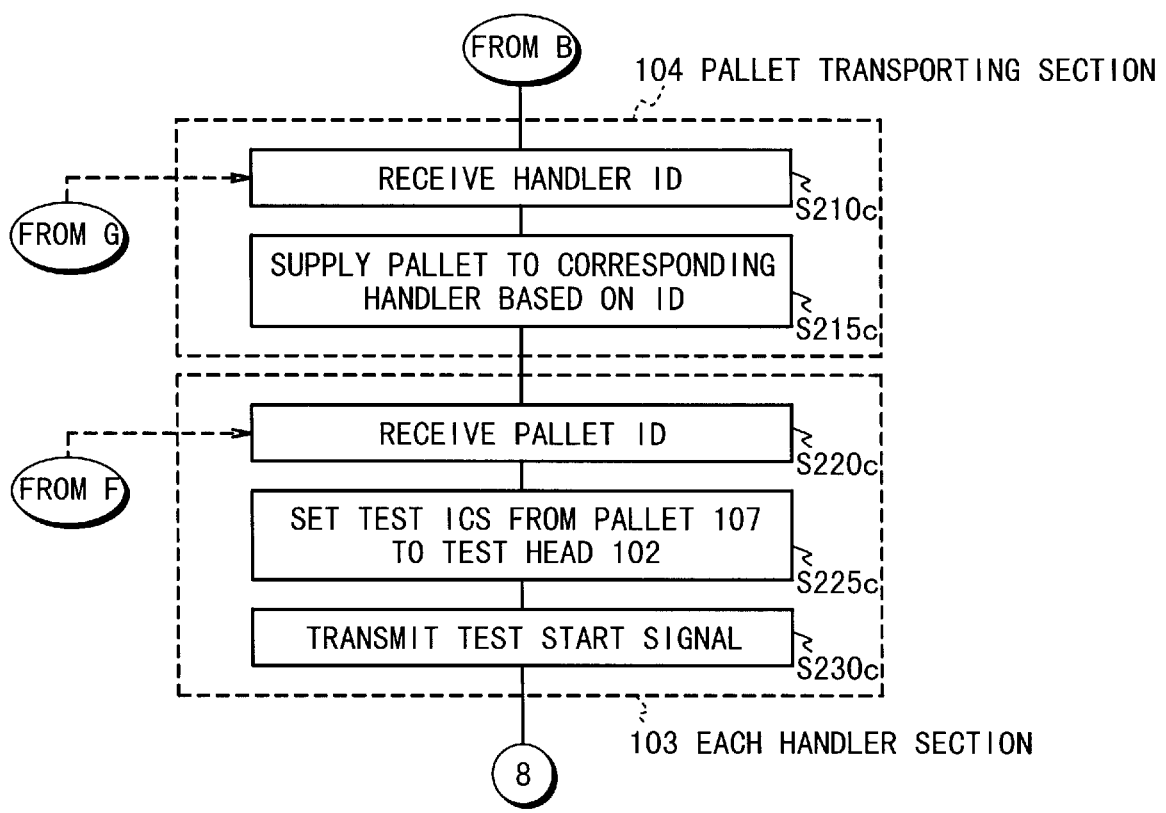
Figure 5G:
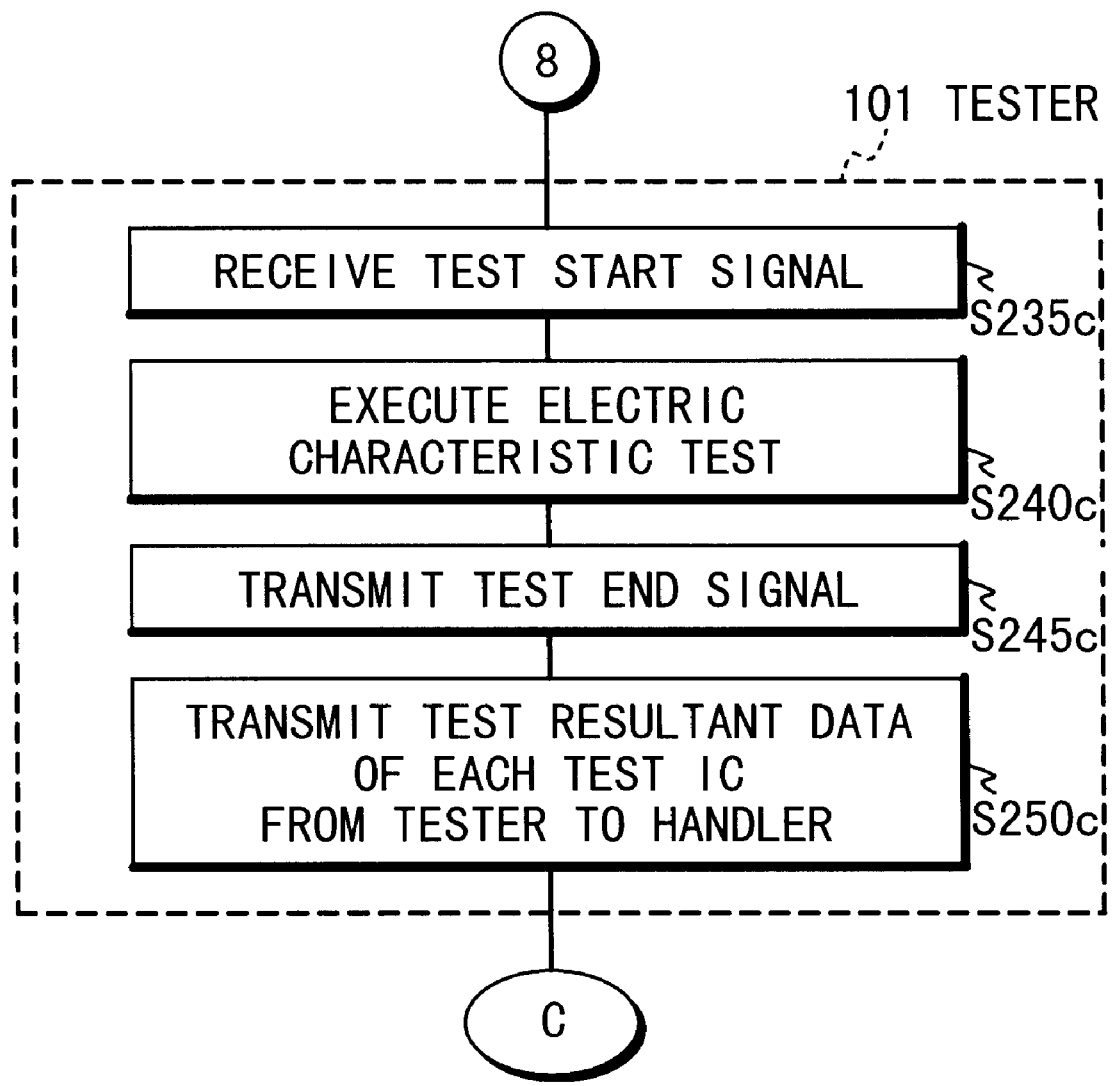

The pallet identifier which has been transmitted in step 260b of FIG. 5E has already arrived to the target handler section 103 (step 220c of FIG. 5F), before the pallet 107 is actually supplied by the pallet transporting section 104. When the pallet 107 is delivered, the bar code reader 114d which is installed in the handler section 103 reads the bar code 301 (see FIG. 6) which is allocated to the pallet 107, and then confirms whether or not the read pallet identifier is coincident with the transmitted pallet identifier. When the read bar code is not coincident with the transmitted pallet identifier, the handler section 103 generates an alarm and temporarily stops operation.

When the read bar code is coincident with the transmitted pallet identifier, the handler section 103 sets the test semiconductor devices from the pallet 107 to the test sockets of the test head 102 (step 225c of FIG. 5F), as shown in FIGS. 7A and 7B.

Figure 1:
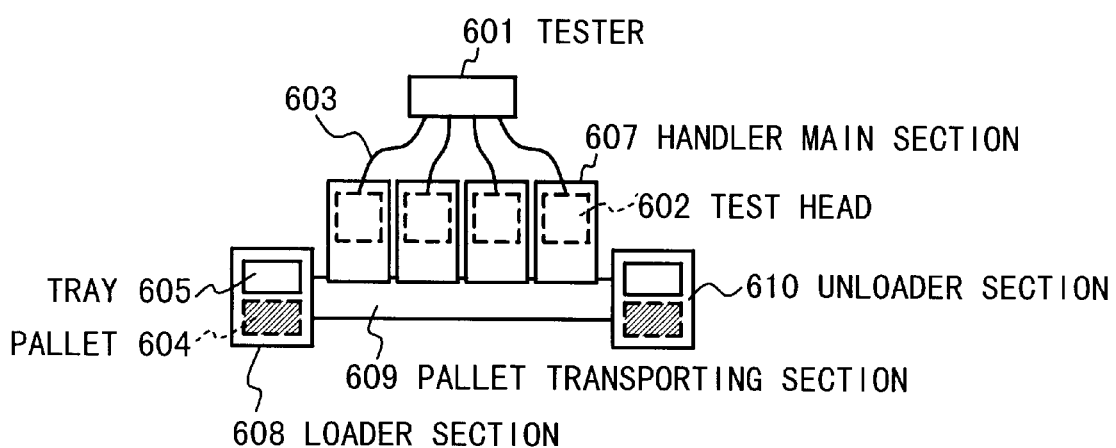
FIG. 1 is a block diagram for illustrating the structure of a conventional example of a semiconductor device test apparatus.
Figure 2A:
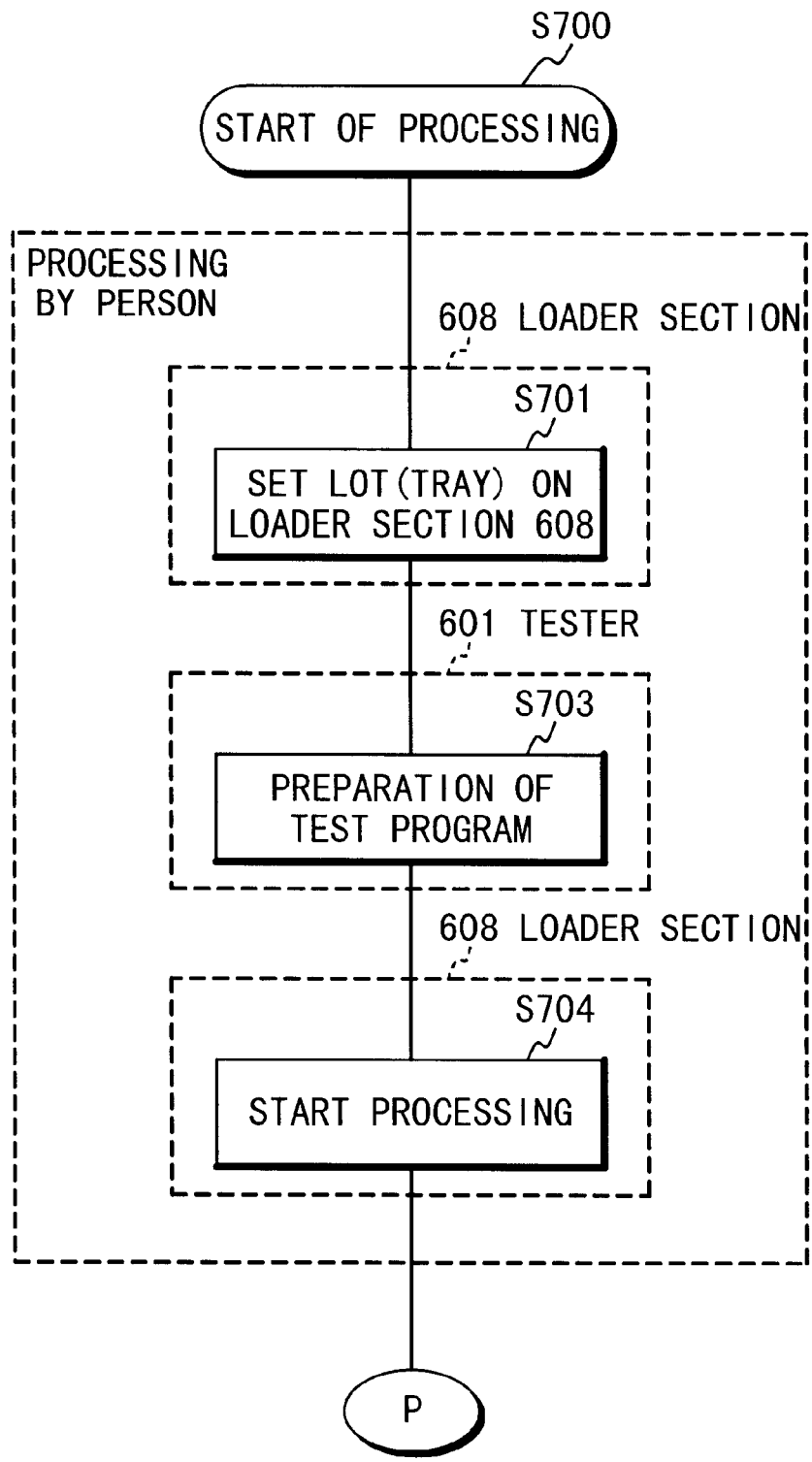
Figure 2B:
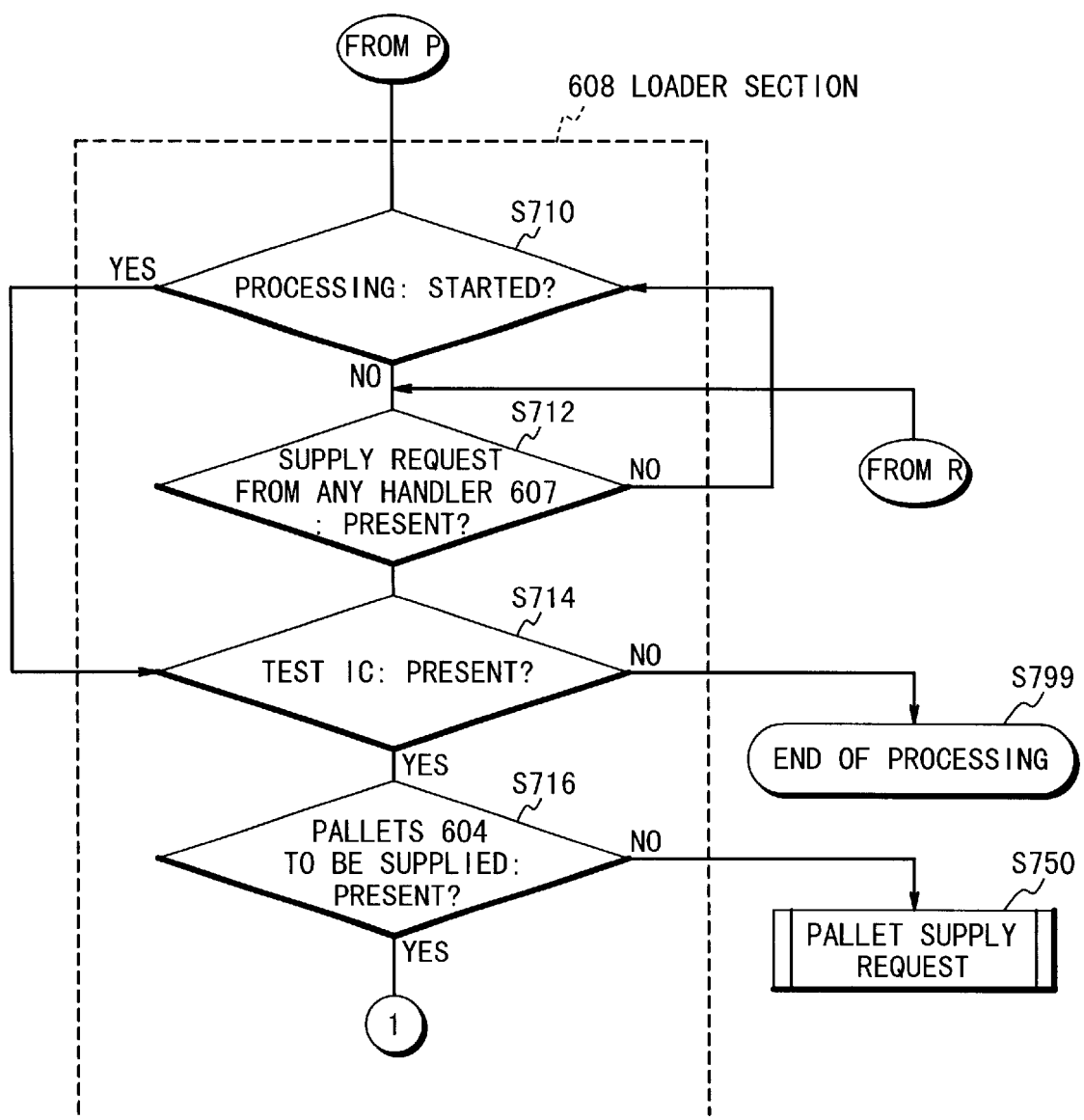
Figure 2C:
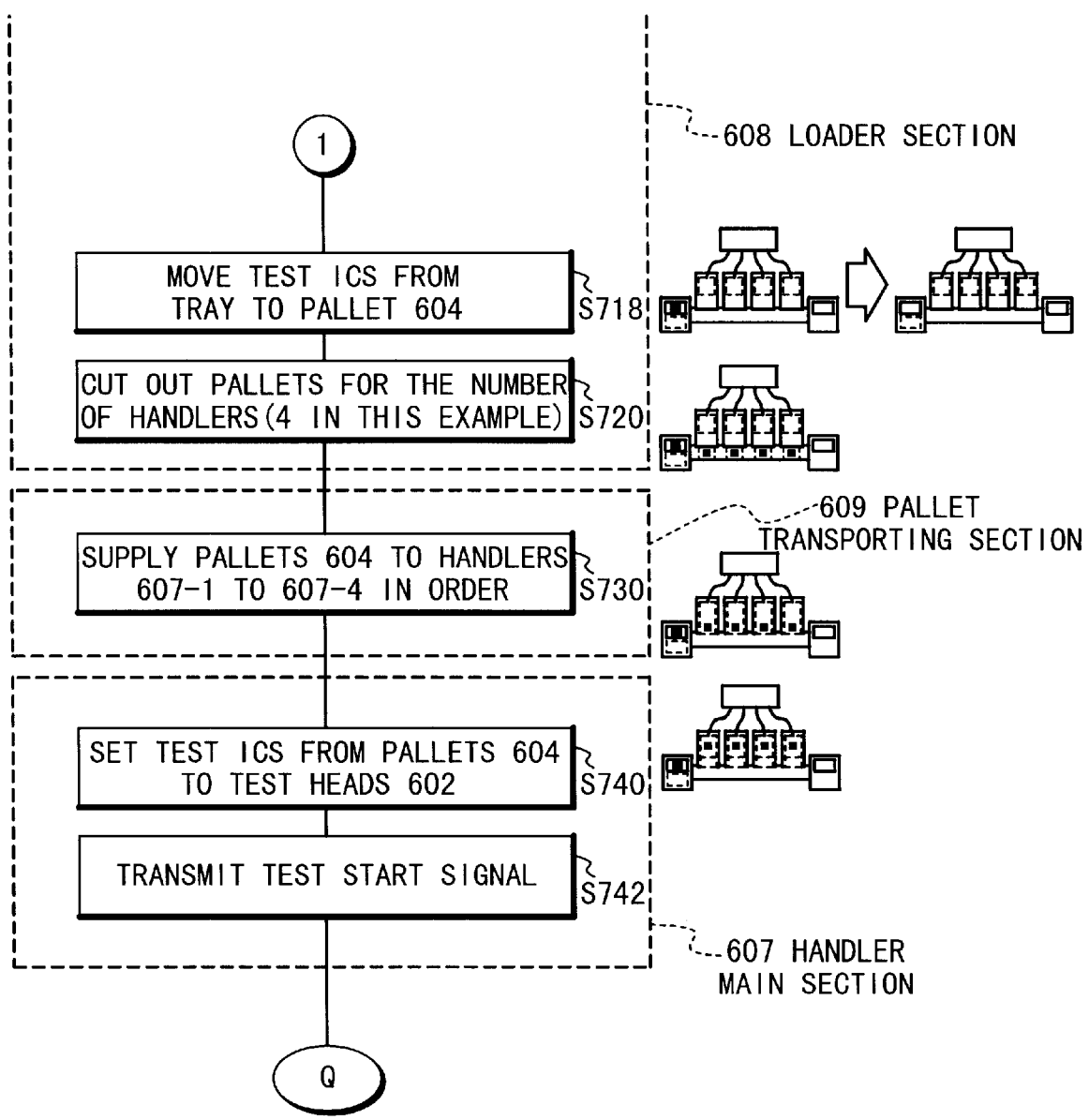
Figure 2D:
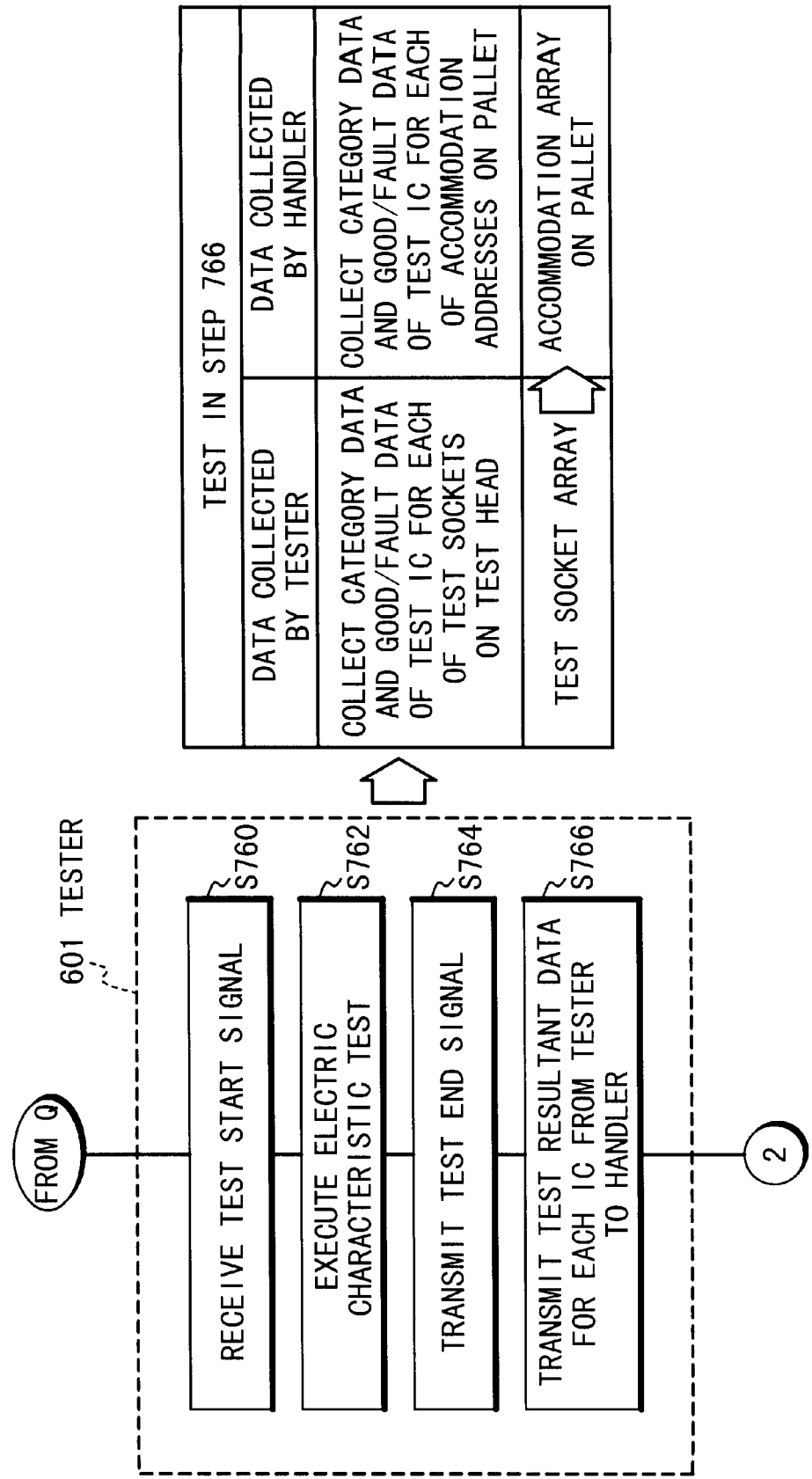
Figure 2F:
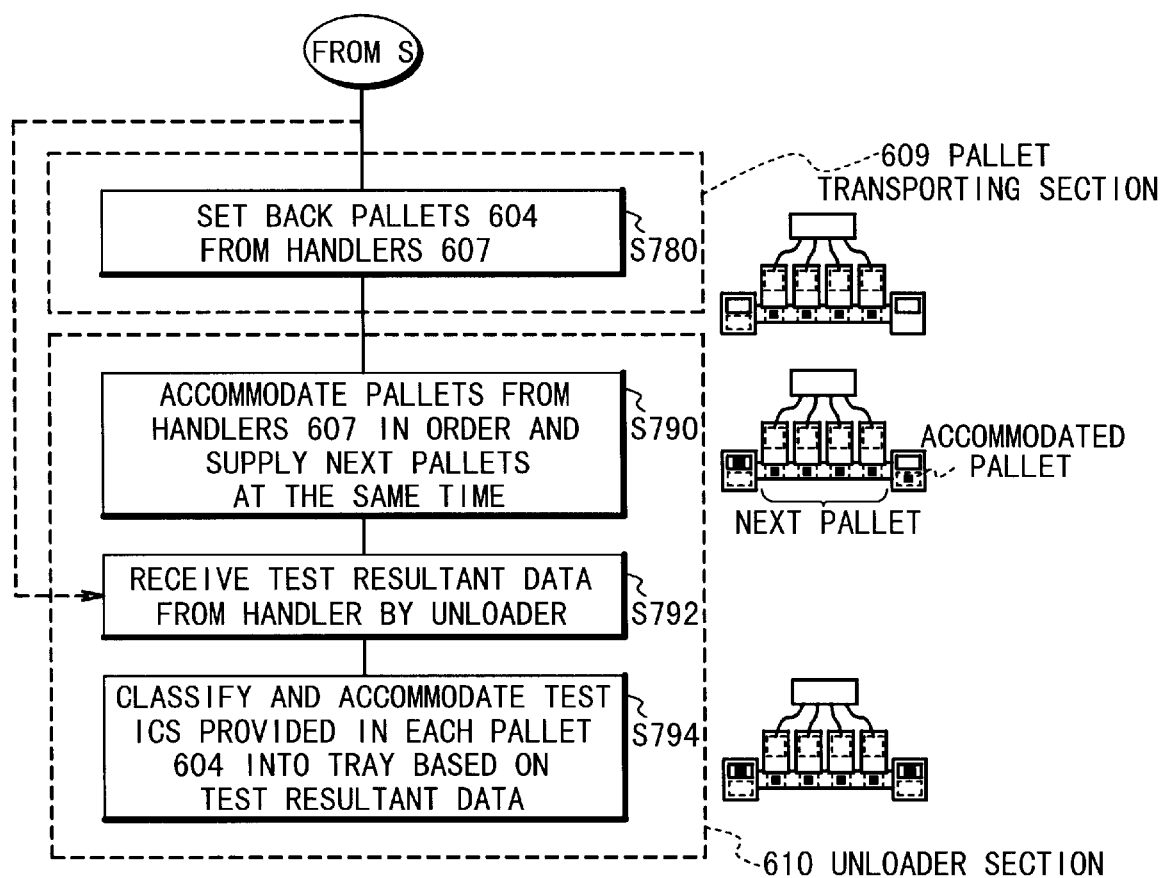

The executing procedure of the electric characteristic test by the tester 101 and the relation of the test semiconductor devices 401, the sockets 402 and the test board 403 are the same as described in the above conventional technique (see the procedure of the steps 742 to 776 of FIGS. 2C to 2E). That is, the handler 103 transmits a test start signal (step 230c of FIG. 5F). The tester 101 receives the test start signal and performs the electric characteristic test of the test semiconductor devices. The tester 101 transmits a test end signal when the test is ended. Also, the tester 101 transmits test resultant data of each of the test semiconductor devices to the handler section (steps 240c to 250c of FIG. 5G). When receiving the test end signal from the tester 101, the handler section 103 receives the test resultant data. The handler section 103 brings back the test semiconductor devices from the test head 102 to the pallet 107, and then requires the next pallet (step 210d to 225d of FIG. 5H).

Figure 5H:
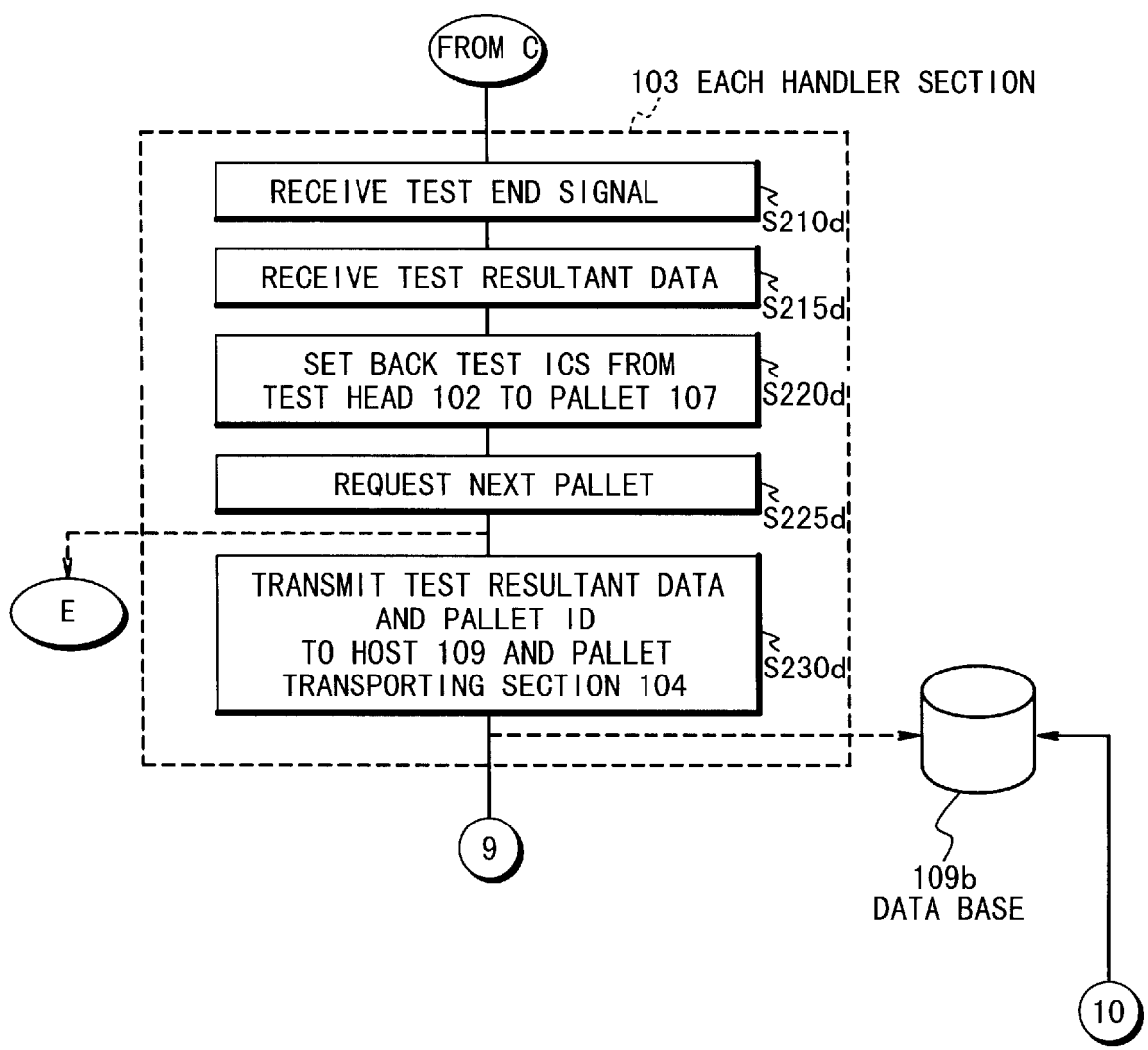
Figure 51:
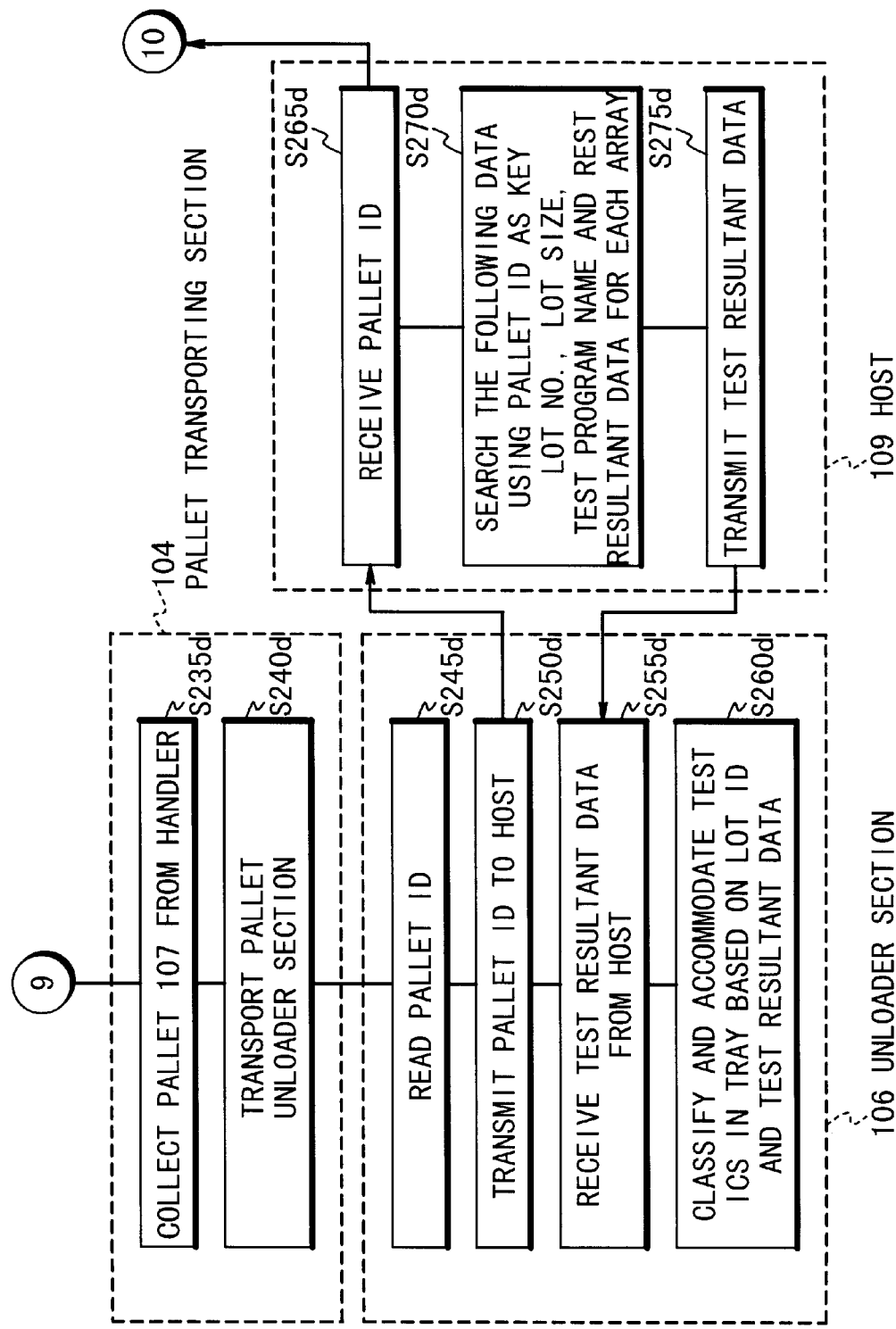

When the electric characteristic test for the pallet 107 is completed, the handler section 103 transmits the test resultant data by the tester 101 and the pallet identifier which has been read by the bar code reader 114d before starting the electric characteristic test, to the host computer 109 and the pallet transporting section 104 (step 230d of FIG. 5H).

When receiving the transmission from the handler section 103, the pallet transporting section 104 collects the pallet 107, which loaded with the test semiconductor devices to which the electric characteristic test is performed, from the handler section 103 (step 235d) to transport to the unloader section 106 (step 240d). The pallet transporting section 104 merely recognizes the data which is transmitted from the handler section 103, as a collection request of the pallet 107.

The data which has been transmitted to the host computer 109 heretofore are completely saved in the data base 109b attached to the host computer 109. The data structure is a list structure as shown in FIG. 9 (X is the pallet identifier in the data structure (1)).

The unloader section 106 reads the pallet identifier of the pallet 107, which has been transported by the pallet transporting section 104, by the bar code reader 114c which is provided for the entrance of the unloader section 106 (step 245d), and transmits the read pallet identifier to the host computer 109 (step 250d). Then, the unloader section 106 waits for an answer such as the test resultant data from the host computer 109.

The host computer 109 receives the pallet identifier which has been transmitted from the unloader section 106 (step 265d), and searches the data base 109b using the received pallet identifier as key information (step 270d). When data records matching the key information are searched, the host computer 109 transmits list information subsequent to the key information to the unloader section 106 (step 275d).

The unloader section 106 receives the searched list information from the host computer 109. The unloader section 106 first recognizes a lot number from the list information, and determines which of 2 blocks of the accommodation section the pallet 107 should be accommodated in. That is, when the other pallets 107 which have the same lot number as the lot number for the pallet 107 are already processed, the unloader section 106 accommodates the pallet 107 in the accommodation section block in which the other pallets are accommodated. If the pallet 107 has a new lot number, the unloader section 106 accommodates the pallet 107 in the other block of the accommodation section in which the lot previously received is not accommodated.

When the blocks of the accommodation section are both empty, the pallet 107 is accommodated in the block designated based on an initial value. When previously arrived lots having different lot numbers from that of the current lot number are accommodated, the unloader section 106 generates an alarm to warn the operator and temporarily stops the operation. Then, the unloader section 106 instructs to take out one of the previously arrived lots from the accommodation section.

After it is determined that the received pallet 107 should be accommodated in which of blocks of the accommodation section, the unloader section 106 recognizes the test resultant data from the received list information transmitted from the host computer 109, and classifies and accommodates the semiconductor devices in the interprocess trays 605 which is prepared for each of defective products and category based on the test resultant data (step 260d).

The above description is concerned with a processing flow of the test semiconductor devices which are loaded into one pallet 107. The processing flow is repeated until all the semiconductor devices 401 on all the pallets 107 are tested in the loader section 105 (steps 245d to 275d).

The data structure (2) which is shown in FIG. 10 indicates the information which is accumulated in the data base 109b of the host computer 109 when a plurality of lots of semiconductor devices are tested using the semiconductor device test apparatus of this embodiment.

Next, the semiconductor device test apparatus according to the second embodiment of the present invention will described below.

In the second embodiment of the present invention, the electric characteristic tests can be performed to a plurality of lots of semiconductor devices on the same test apparatus using the plurality of test programs will be explained.

Because the test apparatus in the second embodiment has the same components as those shown in FIG. 4, the description of the structure is omitted. The operation flow of the semiconductor device test apparatus in the second embodiment will be described with reference to FIGS. 8A to 8E.

Figure 8A:
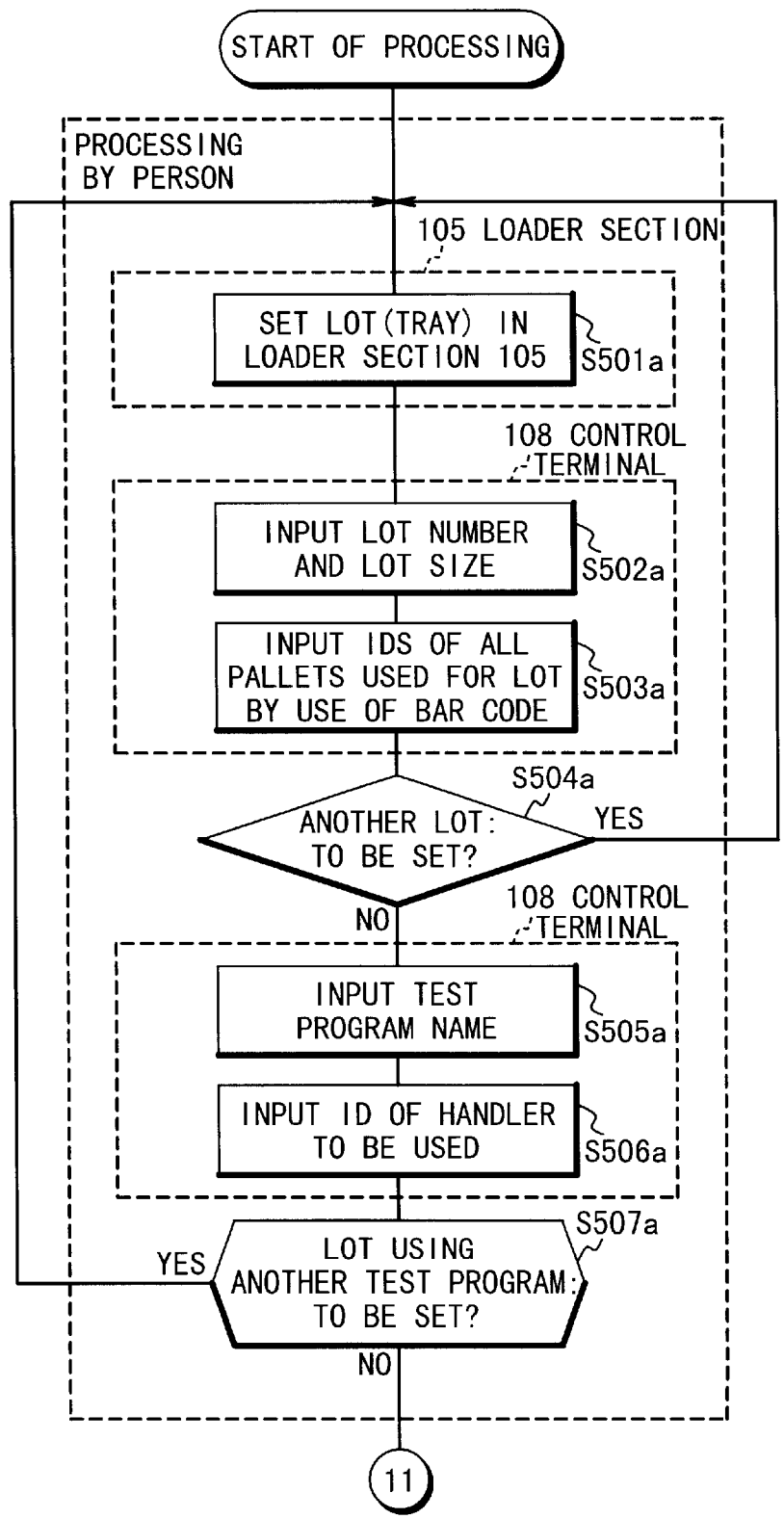
FIGS. 8A to 8E are flow charts to describe the process flow of the semiconductor device test apparatus according to the second embodiment of the present invention.
Figure 8B:
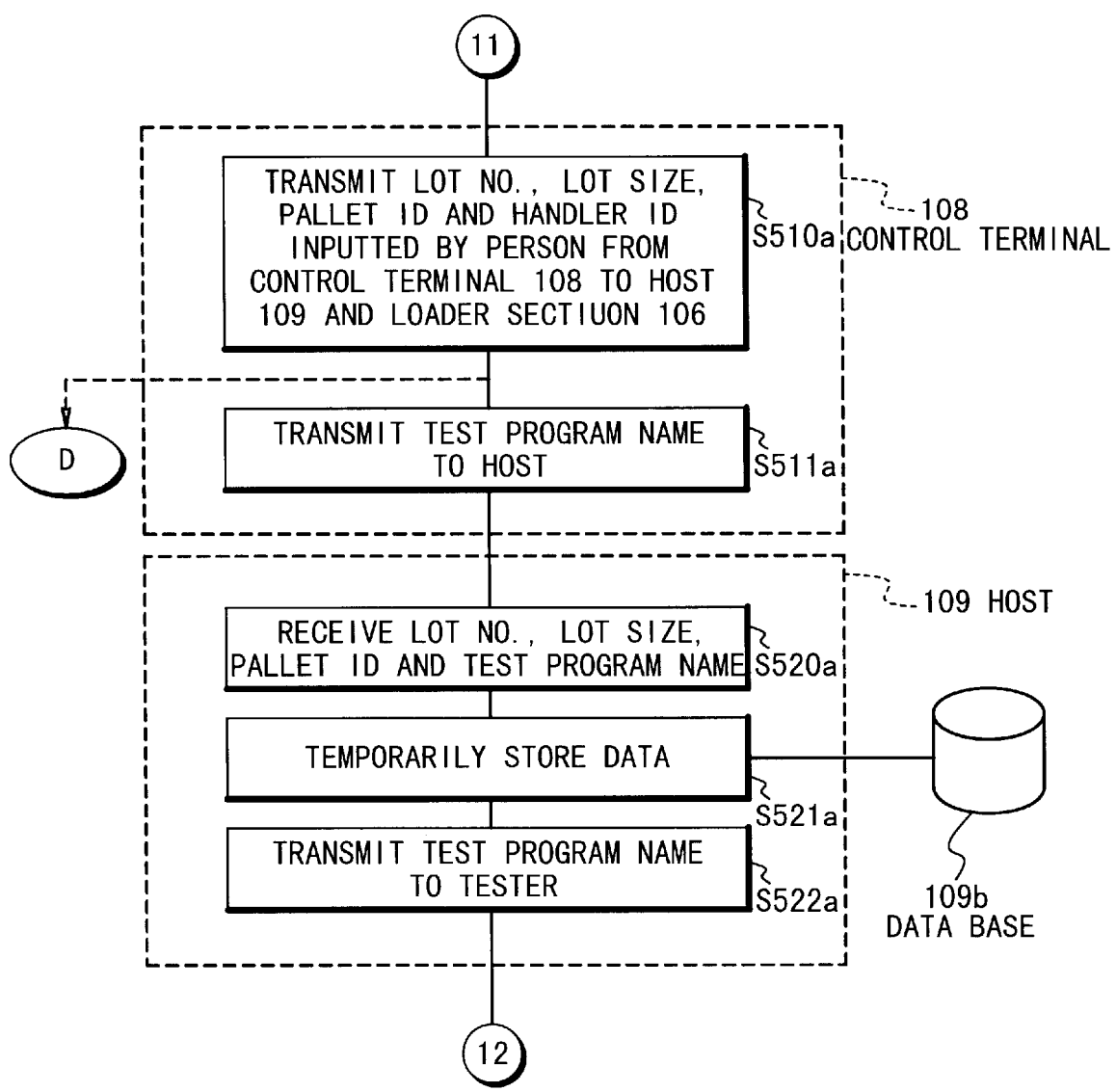

The steps 501a to 507a of FIG. 8A are concerned with the procedure of the information input of the test lot of semiconductor devices to the test apparatus and a preparation procedure for physically setting the lot to the loader section 105.

Like the first embodiment, the operator first supplies the interprocess trays 605 on which test semiconductor devices are loaded, and the pallets 107 to be used from now to the loader section 105. After that, because the operation procedure of the steps 501a to 505a is the same as in the first embodiment, the explanation is omitted.

The second embodiment is different from the first embodiment in steps 506a and 507a.

In the second embodiment, it is inputted from the control terminal 108 to the test apparatus by the operator that the electric characteristic test should be performed to the set lot of semiconductor devices by which of the handler sections 103.

The inputted data is transmitted to the host computer 109 in the steps 510a and 511a, and is temporarily stored in the data base 109b. However, the second embodiment is different from the first embodiment in that a data structure is formed in such a manner that the data structure has the attribute of the handler identifier used for every lot number (see data structure (3) of FIG. 11).

Also, the connection relation of the tester 101 and the handler sections 103 is previously defined as the master data in the form of the data structure (4) which is shown in FIG. 12 in the data base 109b. In the case to transmit a test program name to each of the testers 101 in step 522a, the test program name and the tester 101 are retrieved using the handler identifier as a key and the test program name necessary for each tester is transmitted. For instance, when the handler identifier of 11 is used as a key, the first test program name is transmitted to the tester No. 1 based on the data structures (3) and (4).

Because the operation procedure of the following steps 530a to 551a is the same as that of the steps 230a to 251a in the first embodiment, the explanation is omitted.

Figure 8C:
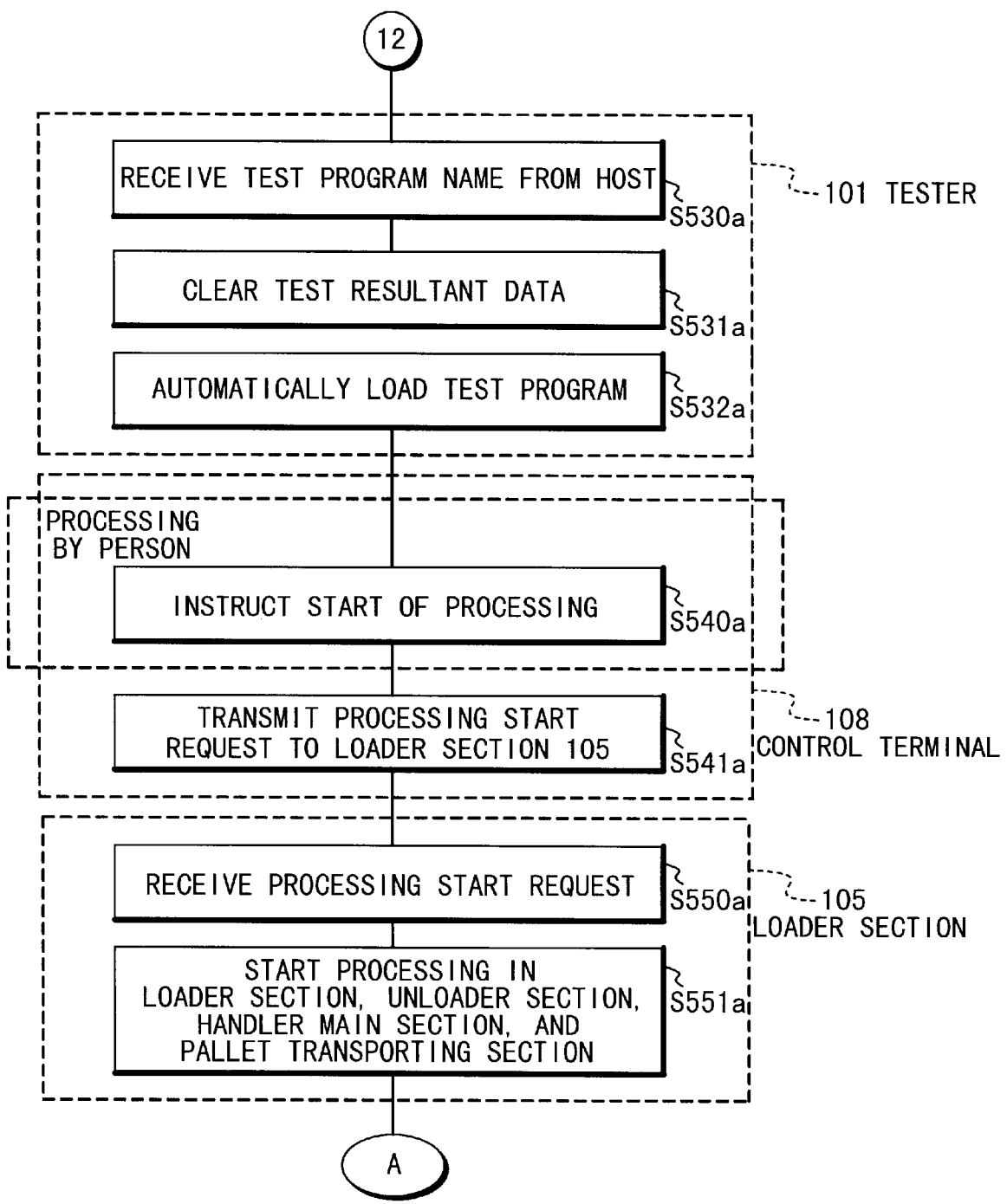
Figure 8D:
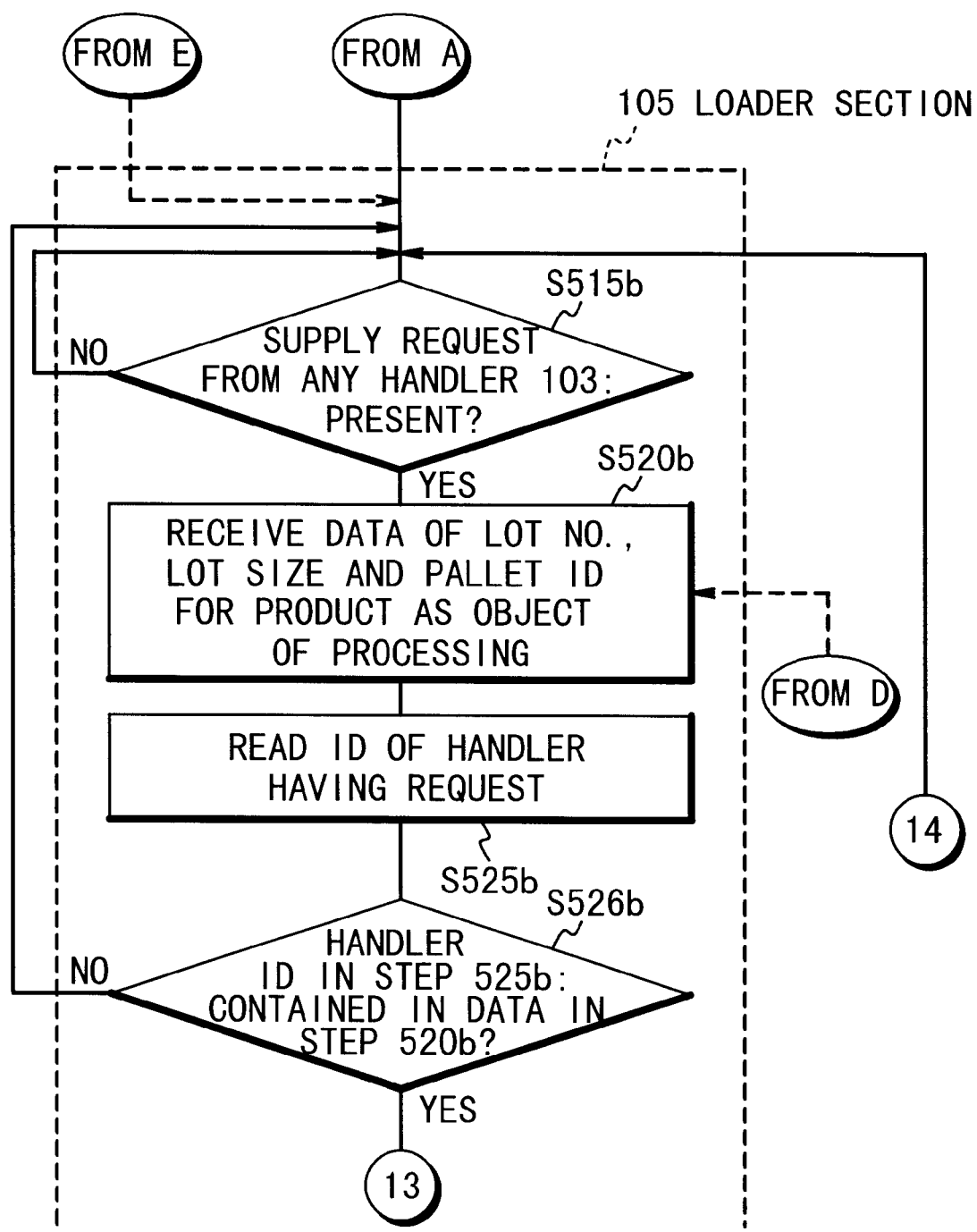
Figure 8E:
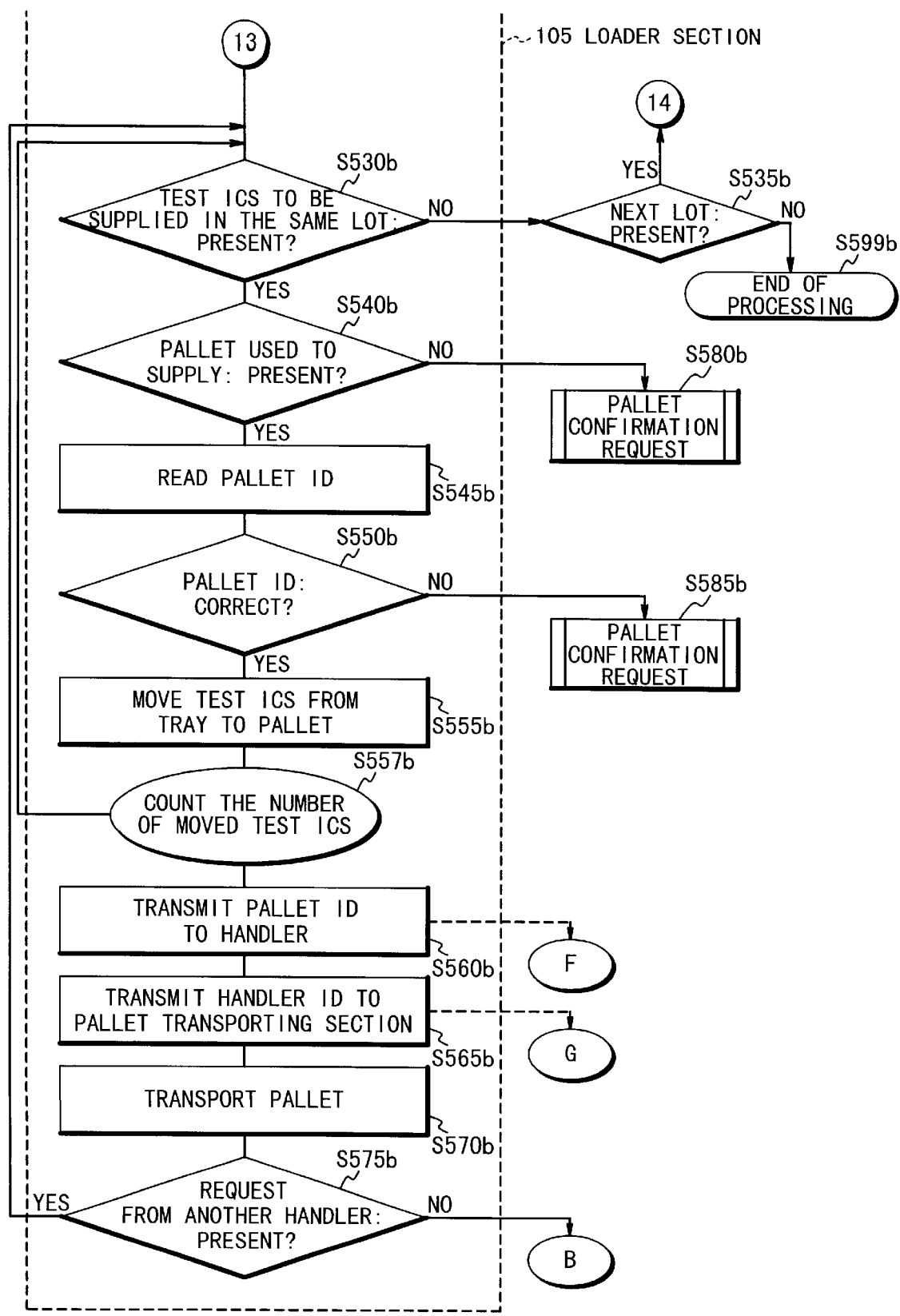

After a processing start signal is received in step 551a as the last step of FIG. 8C, the transporting operation procedure of the pallets 107 to each of the handler sections 103 is executed as shown in FIGS. 8D and 8E. This procedure is equivalent to the procedure which is shown in FIGS. 5D and 5E in the first embodiment. The step 526b as a part of the procedure exists as the step which is peculiar to the second embodiment and, as the result of this, the processing content of the step 520b is different from the first.

In step 520a, various kinds of information (the lot number, the lot size, the pallet identifier and the handler identifier) of the first test lot which are transmitted from the control terminal 108 are received. Even in a case where there is a supply request from one of the handler sections 103 in step 515b, the pallet 107 is not supplied, when there is not the handler identifier among the handler identifier which are described in the data structure (3) which are searched using the lot number as a key.

After this, because all the steps to the step in which the semiconductor devices are accommodated are the same as those in the first embodiment, the explanation is omitted.

As described above, in the second embodiment, the steps 506a, 507a and 526b are provided. Moreover, a modification (each of steps 510a, 520a and 520b) is performed to add the handler identifier in the reception of information in the steps 210a, 220a and 220b. Thus, the electric characteristic tests by the plurality of test programs to a plurality of lots can be realized.

For example, when DRAMs are used as the test semiconductor devices, there is case that a semiconductor device with the memory capacity of 4 MBits and a semiconductor device with the memory capacity of 16 MBits use the same package shape. In this case, the same test apparatus can be applied to both semiconductor devices only by switching the test program which is read into the testers 101 without adjustment of the units such as the handler section 103, the loader section 105, the unloader section 106 and the pallet transporting section 104 which have mechanical positioning mechanisms therein.

According to the first and second embodiments of the present invention, it is possible to make the operation loss reduce, compared with the conventional technique.

The number of semiconductor devices to be processed per a handler section: 16.

The number of handlers per a tester: 4.

When a lot size is uniformly distributed in the range of 2500±31, a theoretical operation loss (which a theoretical loss without considering jamming of the mechanical system and so on) in the conventional technique is 0.65%. Whereas, in the embodiments, it is possible to reduce the theoretical operation loss (0.49% of reduction) to 0.16%.

Also, under qualitative consideration, in this embodiments, because the semiconductor devices can be continuously supplied to the semiconductor device test apparatus depending on the structure, the preparation to be performed in the system can be performed outside of the system. Therefore, the present invention can qualitatively accomplish a good result more than the above quantitative consideration.

As described above, according to the present invention, the effect can be obtained that it is possible to reduce the operation loss compared with the conventional technique. The reason is in that a plurality of lots and a plurality of types can be set in the present invention by connecting the loader mechanism and the unloader mechanism to extend over the plurality of testers, by allocating ID information to each of the pallets, by controlling all of the pallet ID information and the lot information by the host computer, and by controlling the transportation of the pallets by the pallet transporting section.

What is claimed is:

1. A semiconductor device test apparatus comprising:
   a network;
   a host computer connected to said network and having a data base; for writing test resultant data in said data base, and for outputting said test resultant data in response to a data request;
   a plurality of testers connected to said network, each said tester having a memory and a computer readable medium attached thereto, wherein each of said plurality of tests performs an electric characteristic test based on a particular test program loaded from the respective computer readable medium into the respective tester memory to generate a test resultant data for each of semiconductor devices, and transmits said test resultant data to said host computer;
   a plurality of handler sections, which are grouped into a plurality of sets corresponding to said plurality of handler sections sets said semiconductor devices of a pallet transported thereto to a test head for said electric characteristic test, each of said plurality of testers having said test heads for corresponding handler sections;
   a loader section operatively connected to said network, for loading said semiconductor devices from a first tray to said pallet;
   an unloader section connected to said network, for unloading said semiconductor devices from said pallet transported thereto to second trays based on said test resultant data from said host computer; and
   a pallet transporting section for transporting said pallet to a specific one of said plurality of handler sections before said electric characteristics test, and for transporting said pallet to said unloader section from said specific one of said plurality of handler sections after said electric characteristic test.

2. A semiconductor device test apparatus according to claim 1, wherein each of said plurality of handler sections issues a supply request as a request issuing handler section, and
   wherein said loader section identifies said request issuing handler section from said supply request to obtain a handler section identifier, loads said semiconductor devices to said pallet, and informs said handler section identifier to said pallet transporting section, and
   wherein said pallet transporting section transports said pallet to said request issuing handler section.

3. A semiconductor device test apparatus according to claim 2, wherein said loader section informs a pallet identifier of said pallet to said request issuing handler section, and
   wherein each of said plurality of handler sections receives said pallet identifier when issuing said supply request, and compares a pallet identifier of said transported pallet with the received pallet identifier, and receives said pallet from said pallet transporting section when both of said pallet identifiers are coincident with each other.

4. A semiconductor device test apparatus according to claim 1, wherein each of said plurality of tests automatically loads said particular test program in response to a test program name.

5. A semiconductor device test apparatus according to claim 4, further comprising a control terminal connected to said network, for transmitting said test program name inputted thereto to said plurality of testers via said network.

6. A semiconductor device test apparatus according to claim 5, wherein said control terminal transmits a pallet identifier of said pallet to said host computer, and
   wherein said host computer stores said pallet identifier in said data base, and stores said test resultant data for each of said semiconductor devices loaded in said pallet in said data base in relation to said pallet identifier.

7. A semiconductor device test apparatus according to claim 1, wherein said unloader section reads a pallet identifier of said pallet transported thereto, and outputs said read pallet identifier to said host computer as the data request, and
   wherein said host computer reads a data set associated with said read pallet identifier and containing said test resultant data from said data base to output to said unloader section.

8. A semiconductor device test apparatus according to claim 1, further comprising a control terminal for inputting and transmitting to said host computer and said loader section, a plurality of lot numbers of lots, pallet identifiers of a plurality of said pallets used for each of said lots, handler identifiers of ones of said plurality of handler sections used for each of said lots, and test program names for one of said plurality of testers corresponding to said handler identifiers, each of the lots including said semiconductor devices.

9. A semiconductor device test apparatus according to claim 8, wherein each of said plurality of handler sections issues a supply request as a request issuing handler section, and
   wherein said loader section identifies said request issuing handler section from said supply request to obtain a handler section identifier, determines whether said obtained handler section identifier is present in the handler section identifiers for a current lot transmitted from said control terminal, neglects said supply request when said obtained handler section identifier is not present in the handler section identifiers for the current lot, loads said semiconductor devices to said pallet when said obtained handler section identifier is present in the handler section identifiers for the current lot, and informs said handler section identifier to said pallet transporting section, and wherein said pallet transporting section transports said pallet to said request issuing handler section.

10. A semiconductor device test apparatus according to claim 9, wherein said loader section informs a pallet identifier of said pallet to said request issuing handler section, and wherein each of said plurality of handler sections receives said pallet identifier when issuing said supply request, and compares a pallet identifier of said transported pallet with the received pallet identifier, and receives said pallet from said pallet transporting section when both of said pallet identifiers are coincident with each other.

11. A semiconductor device test apparatus according to claim 8, wherein said host computer outputs said test program names to said plurality of testers, respectively, and wherein each of said plurality of testers receives said test program name and automatically loads said test program in response to said test program name.

12. A semiconductor device test apparatus according to claim 8, wherein said host computer stores said pallet identifiers for each of the lots in said data base, and stores said test resultant data for each of said semiconductor devices loaded in said pallet supplied from each of said plurality of testers in said data base in relation to said pallet identifier.

13. A method of testing semiconductor devices in a test apparatus, comprising the steps of:

loading semiconductor devices for a particular lot to pallets by a loader section;

performing a first transportation of each of said pallets to a specific one of a plurality of handler sections, before an electric characteristic test, by a transport section;

setting said semiconductor devices of said pallet to a test head of a tester corresponding to said specific handler section;

performing said electric characteristic test based on a particular test program by a tester corresponding to said specific handler section to generate a test resultant date for each of said semiconductor devices, said particular test program loaded from a computer readable medium attached to the tester into a memory of the tester;

storing said test resultant data in a data base in association with said pallet by a host computer; performing a second transportation of said pallet to an unloader section from said specific one of said plurality of handler sections after said electric characteristic test by said transport section;

unloading said semiconductor devices to second trays based on said test resultant data from said host computer.

14. A method according to claim 13, wherein said loading step includes:

issuing a supply request from said specific handler section;

identifying said specific handler section from said supply request to obtain a handler section identifier; and loading said semiconductor devices to said pallet, and wherein said step of performing a first transportation includes transporting said pallet to said specific handler section based on the obtained handler section identifier.

15. A method according to claim 14, wherein said setting step includes:

informing a pallet identifier of said pallet to said specific handler section;

comparing a pallet identifier of said transported pallet with the informed pallet identifier; and receiving said pallet when both of said pallet identifiers are coincident with each other.

16. A method according to claim 13, wherein said step of performing said electric characteristic test includes automatically loading said particular test program in response to a test program name.

17. A method according to claim 16, wherein said further comprising said step of performing said electric characteristic test further includes receiving said test program name from a control terminal.

18. A method according to claim 16, wherein said storing step includes:

receiving a pallet identifier of said pallet by said host computer; and storing said pallet identifier in said data base;

storing said test resultant data for each of said semiconductor devices loaded in said pallet in said data base in relation to said pallet identifier.

19. A method according to claim 13, wherein said unloading step includes:

reading a pallet identifier of said pallet;

transmitting said read pallet identifier to said host computer as the data request; and reading a data set associated with said read pallet identifier and containing said test resultant data from said data base.

20. A method according to claim 13, further comprising the step of transmitting to said host computer and said loader section, a plurality of lot numbers of lots, pallet identifiers of a plurality of said pallets used for each of said lots, handler identifiers of ones of said plurality of handler sections used for each of said lots, and test program names for ones of said plurality of testers corresponding to said handler identifiers, each of the lots including said semiconductor devices, and wherein said loading step includes:

issuing a supply request from said specific handler section; and identifying said specific handler section from said supply request to obtain a handler section identifier;

determining whether said obtained handler section identifiers for a current lot transmitted from said control terminal;

neglecting said supply request when said obtained handler section identifier is not present in the handler section identifiers for the current lot;

loading said semiconductor devices to said pallet when said obtained handler section identifier is present in the handler section identifiers for the current lot.

21. A method according to claim 20, wherein said step of performing a first transportation includes:

informing said handler section identifier to said transporting section; and transporting said pallet to said specific handler section.

22. A method according to claim 20, wherein said step of performing an electric characteristic test includes:
   outputting a corresponding one of said test program name to said tester; and
   receiving said corresponding test program name to automatically load said test program in response to said test program name.

23. A method according to claim 13, wherein said storing step includes:

storing said pallet identifiers for each of the lots in said data base; and storing said test resultant data for each of said semiconductor devices loaded in said pallet supplied from each of said plurality of testers in said data base in relation to said pallet identifier.

* * * * *